(12) United States Patent  
Chou et al.

(10) Patent No.: US 11,489,950 B2  
(45) Date of Patent: *Nov. 1, 2022

(54) MOBILE DEVICE STAND

(71) Applicant: Superior Communications, Inc., Irwindale, CA (US)

(72) Inventors: Vivian Wei-Fen Chou, Diamond Bar, CA (US); Jonathan Fong, Laguna Niguel, CA (US)

(73) Assignee: Superior Communications, Inc., Irwindale, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/107,744

(22) Filed: Nov. 30, 2020

(65) Prior Publication Data

US 2021/0084132 A1 Mar. 18, 2021

Related U.S. Application Data

(63) Continuation of application No. 16/557,258, filed on Aug. 30, 2019, now Pat. No. 10,855,821.

(51) Int. Cl.
*H04M 1/02* (2006.01)
*G06F 1/16* (2006.01)
*H05K 5/02* (2006.01)

(52) U.S. Cl.
CPC ............ *H04M 1/026* (2013.01); *G06F 1/166* (2013.01); *G06F 1/1681* (2013.01); *H05K 5/0204* (2013.01); *H05K 5/0221* (2013.01); *H05K 5/0226* (2013.01); *H05K 5/0234* (2013.01)

(58) Field of Classification Search
None
See application file for complete search history.

(56) References Cited

U.S. PATENT DOCUMENTS

| | | | |
|---|---|---|---|
| 8,162,283 B1* | 4/2012 | Royz | F16M 11/10 248/455 |
| 9,372,507 B2* | 6/2016 | Dekock | G06F 1/1626 |
| 9,717,314 B2* | 8/2017 | Idehara | G06F 1/166 |
| 9,723,735 B1* | 8/2017 | Kim | E05F 1/1215 |
| 9,958,906 B2* | 5/2018 | Ho | F16M 11/2021 |
| 10,001,243 B2* | 6/2018 | Cavalcante | A45F 5/00 |
| 10,326,487 B2* | 6/2019 | Mody | H04B 1/3877 |
| 10,327,571 B1* | 6/2019 | Bradford | A47G 1/0633 |
| 2005/0254875 A1* | 11/2005 | Hui-hu | G06F 3/0208 400/472 |
| 2009/0244872 A1* | 10/2009 | Yan | H05K 5/0234 361/807 |

(Continued)

*Primary Examiner* — Gennadiy Tsvey
(74) *Attorney, Agent, or Firm* — Snell & Wilmer LLP

(57) ABSTRACT

A stand for a mobile device. The stand includes a back plate having a pair of parallel tracks, the back surface of the back plate attached to a back surface of the mobile device. The stand includes a sliding plate having a first end coupled to the back plate and configured to slide along the pair of parallel tracks. The stand includes a pivot plate having a first end connected to the second end of the sliding plate at a hinge, a second end connected to the back plate, and the pivot plate is configured to pivot relative to the back plate when the first end of the sliding plate slides along the pair of parallel tracks. The pivot plate, the sliding plate, and the back plate form one or more channels for receiving one or more fingers of a user when the stand is in the deployed position.

20 Claims, 26 Drawing Sheets

(56) References Cited

U.S. PATENT DOCUMENTS

| | | | |
|---|---|---|---|
| 2010/0051775 A1* | 3/2010 | Wu | F16M 11/10 248/371 |
| 2011/0050063 A1* | 3/2011 | Wang | H04N 1/00562 312/351.1 |
| 2012/0097831 A1* | 4/2012 | Olukotun | F16M 13/022 248/688 |
| 2012/0103855 A1* | 5/2012 | Gaddis, II | G06F 1/1628 206/521 |
| 2013/0277237 A1* | 10/2013 | Wang | A45C 11/00 206/45.2 |
| 2014/0098478 A1* | 4/2014 | Gallagher | F16M 11/105 361/679.02 |
| 2014/0262854 A1* | 9/2014 | Chen | A45C 11/00 206/45.24 |
| 2014/0332418 A1* | 11/2014 | Cheung | H04M 1/04 206/45.2 |
| 2014/0347814 A1* | 11/2014 | Zaloom | A45C 13/36 361/679.56 |
| 2016/0036480 A1* | 2/2016 | Hirsch | A45F 5/021 455/575.6 |
| 2016/0273702 A1* | 9/2016 | Shiba | F16M 11/10 |
| 2018/0052498 A1* | 2/2018 | Nakagaki | G06F 1/1681 |
| 2020/0028951 A1* | 1/2020 | Hummel | H04B 1/3877 |
| 2020/0036825 A1* | 1/2020 | Cheswick | H04M 1/04 |

* cited by examiner

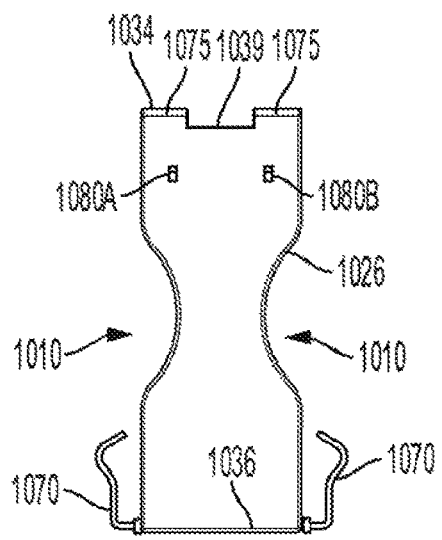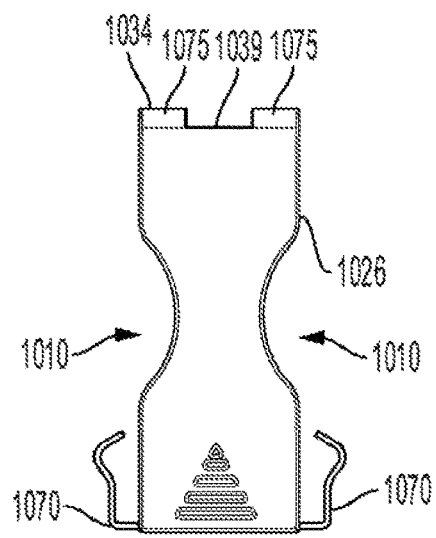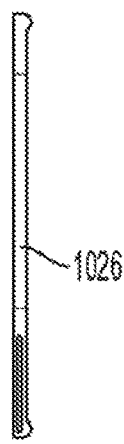
FIG. 14A  FIG. 14B  FIG. 14C
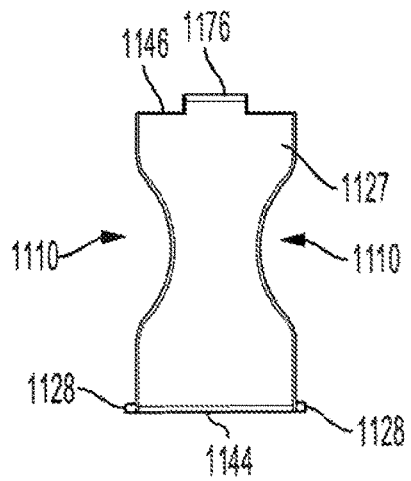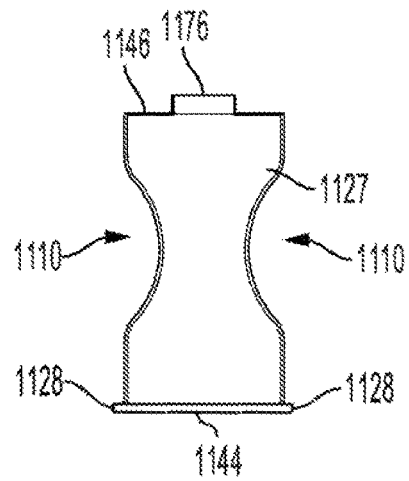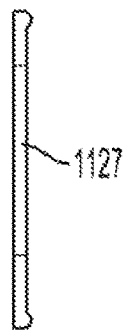
FIG. 15A  FIG. 15B  FIG. 15C
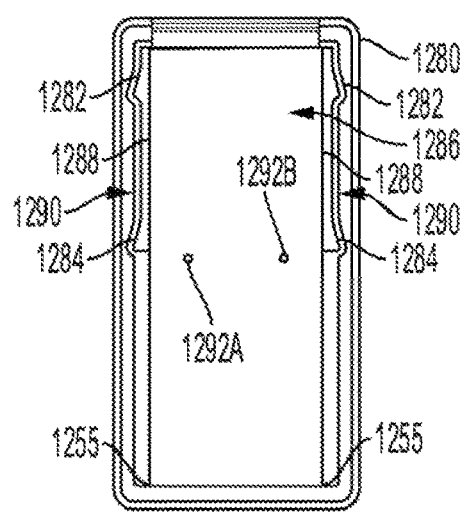
FIG. 16

MOBILE DEVICE STAND

CROSS-REFERENCE TO RELATED APPLICATIONS

This application is a continuation of U.S. patent application Ser. No. 16/557,258, titled "MOBILE DEVICE STAND," filed on Aug. 30, 2019, the entire contents of which is hereby incorporated by reference herein.

BACKGROUND

1. Field

The present disclosure relates to an apparatus and/or system for securely holding a mobile device and/or positioning a mobile device on a surface.

2. Description of the Related Art

Mobile devices such as smartphones and tablet computers are used by many individuals. Over time, mobile devices have generally grown larger in screen size and thinner in thickness. In addition, materials with smooth surfaces are frequently used in the back surfaces of mobile devices. As a result, mobile devices are harder for users to manipulate using one hand. Thus, there is a need for an apparatus or system for improving the ability to manipulate and view a mobile device.

SUMMARY

What is described is a stand for a mobile device. The stand moves between a flat position and a deployed position. The stand includes a back plate having a back surface, a front surface, a top edge, and a bottom edge, the back plate including a pair of parallel tracks located on the front surface of the back plate and extending in a direction from the bottom edge of the back plate toward the top edge of the back plate, the back surface of the back plate attached to a back surface of the mobile device. The stand includes a sliding plate having a first end and a second end, the first end of the sliding plate coupled to the back plate and configured to slidably move along the pair of parallel tracks, and the sliding plate configured to pivot relative to the back plate. The stand includes a pivot plate having a first end and a second end, the first end of the pivot plate connected to the second end of the sliding plate at a hinge, the second end of the pivot plate connected to the back plate, and the pivot plate configured to pivot relative to the back plate when the first end of the sliding plate slidably moves along the pair of parallel tracks. The pivot plate, the sliding plate, and the back plate form a triangular channel when the stand is in the deployed position, the channel configured to receive a finger of a user, allowing the user to hold the mobile device in a portrait orientation.

Also described is a stand attached to a back surface of a mobile device. The stand includes a back plate having a front surface, a top edge, and a bottom edge, the back plate including a pair of parallel tracks located on the front surface of the back plate and extending in a direction from the bottom edge of the back plate toward the top edge of the back plate. The stand includes a sliding plate having a first end and a second end, the first end of the sliding plate coupled to the back plate and configured to slidably move relative to the pair of parallel tracks, and the sliding plate configured to pivot relative to the back plate. The stand includes a pivot plate having a first end and a second end, the first end of the pivot plate connected to the second end of the sliding plate at a hinge, the second end of the pivot plate connected to the back plate, and the pivot plate configured to pivot relative to the back plate when the first end of the sliding plate slidably moves relative to the pair of parallel tracks. An edge of the mobile device and the hinge are contact points for holding the mobile device at a viewing angle in a landscape orientation or a portrait orientation.

Also described is a stand for a mobile device. The stand moves between a flat position and a deployed position. The stand includes a back plate. The back plate includes a pair of parallel tracks located on a front surface of the back plate, and a back surface attached to a back surface of the mobile device. The stand includes a panel. The panel includes a sliding portion coupled to the back plate at a first end, being configured to pivot relative to the back plate at the first end, and being configured to move adjacent to the pair of parallel tracks to move the stand from the flat position to the deployed position. The panel also includes a pivot portion being flexibly connected to the sliding portion at a first end and connected to the back plate at a second end, the pivot portion configured to pivot relative to the back plate when the first end of the sliding plate slidably moves along the pair of parallel tracks, the panel and the back plate forming a channel when the stand is in the deployed position, the channel configured to receive a finger of a user, allowing the user to hold the mobile device in a portrait orientation.

BRIEF DESCRIPTION OF THE DRAWINGS

Other systems, methods, features, and advantages of the present invention will be apparent to one skilled in the art upon examination of the following figures and detailed description. Component parts shown in the drawings are not necessarily to scale, and may be exaggerated to better illustrate the important features of the present invention.

FIGS. 14A-14C illustrate various views of the sliding plate, according to various embodiments of the invention.

FIGS. 15A-15C illustrate various views of the pivot plate, according to various embodiments of the invention.

FIG. 16 illustrates the back plate, according to various embodiments of the invention.

DETAILED DESCRIPTION

Disclosed herein are systems, apparatuses, and methods for assisting in the holding of a mobile device by a user and/or assisting in the viewing or positioning of a mobile device. Conventional attachments meant to attach to the back surface of a mobile device for improving grip of the user to the mobile device have many shortcomings. In particular, the conventional attachments may be bulky and prevent wireless charging, the conventional attachments may be made of materials, such as metal, that prevent wireless charging, and the conventional attachments may require use of two hands to deploy for use. The systems and apparatuses described herein may be deployed with one hand, have a profile that is sufficiently low to allow wireless charging of the mobile device, and be made of materials that do not inhibit wireless charging of the mobile device.

Figure 1:
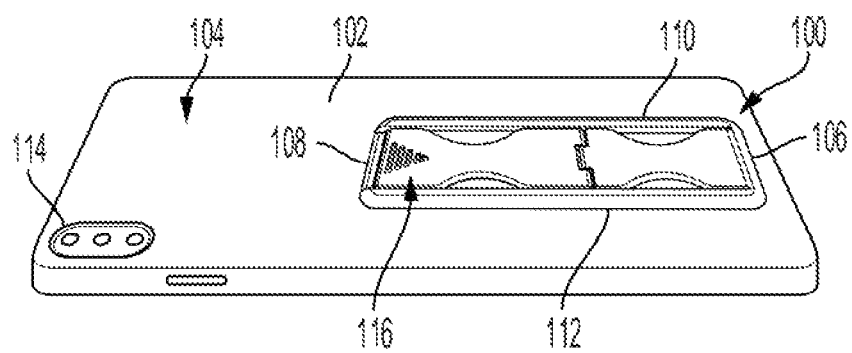
FIG. 1 illustrates a stand attached to a back surface of a mobile device in a first orientation, according to various embodiments of the invention.

FIG. 1 illustrates a stand 100 attached to a back surface 104 of a mobile device 102 in a first orientation. The mobile device 102 may be a smartphone, a tablet, or any portable device with a screen. The stand 100 may be attached directly to the back surface 104 of the mobile device or may be attached to a back surface of a case that is attached to the mobile device 102. Thus, as used herein, "back surface of the mobile device" may refer to the back surface of the mobile device or the back surface of a case attached to the mobile device.

The stand 100 has a top edge 106, a bottom edge 108, a left edge 110, a right edge 112, and a deployment grip 116. While FIG. 1 illustrates the top edge 106 of the stand 100 being substantially aligned with the bottom edge of the mobile device 102, the stand 100 may be placed at any location on the back surface 104 of the mobile device 102. In many situations, the user applying the stand 100 to the mobile device 102 may avoid covering features of the mobile device 102, such as a camera 114 or a fingerprint sensor. In some situations, the user may desire to avoid locating the stand 100 at a location along an edge of the mobile device 102, as the user may dock the mobile device 102 or otherwise desire to have clearance along the edge of the mobile device 102. In this way, the user is able to locate the stand 100 at an optimal location for the user based on the user's usage of the mobile device 102 and the features of the mobile device 102.

As shown in FIG. 1, the stand 100 is in a first position, or a flat position. In the flat position, the stand 100 is substantially flat and parallel with the back surface 104 of the mobile device 102.

Figure 2:
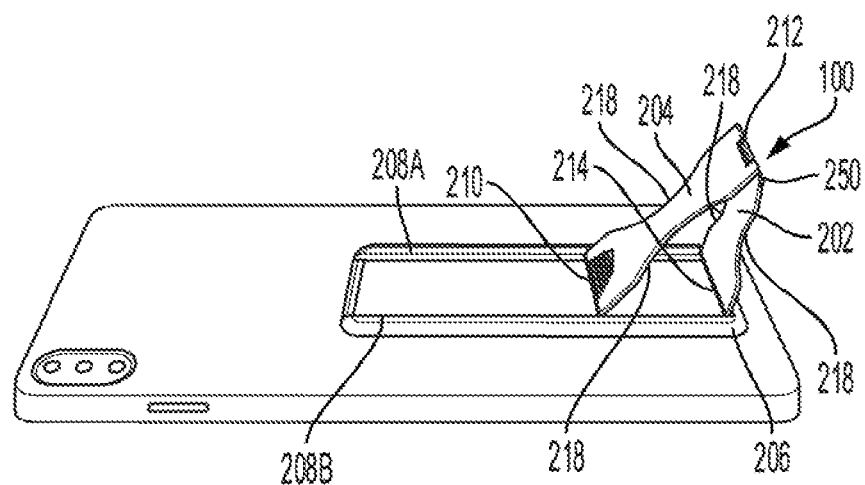
FIG. 2 illustrates the stand in a deployed position in the first orientation, according to various embodiments of the invention.

FIG. 2 illustrates the stand 100 in a second position, or a deployed position. In the deployed position, a pivot plate 202 and a sliding plate 204 form a triangle shape with a back plate 206 of the stand 100. The back plate 206 may form substantially the entire height and width of the stand 100. The back plate 206 may also include parallel tracks 208 (i.e., left track 208A and right track 208B). The sliding plate 204 may slide along the parallel tracks 208 toward the top edge 106 of the stand 100 to move the stand 100 from the flat position shown in FIG. 1 to the deployed position shown in FIG. 2.

The user may apply force to a sliding edge 210 of the sliding plate 204 in a direction toward the top edge 106. The force may be in a direction that is substantially parallel with the back surface 104 of the mobile device 102. The relative positioning of the sliding plate 204, the pivot plate 202, the parallel tracks 208, and the back plate 206 may be such that the force from a single finger of the user upon the sliding edge 210 of the sliding plate 204 is sufficient to move the stand 100 from the flat position to the deployed position. The mechanics of the movement from the flat position to the deployed position are described in more detail in FIGS. 11A-11C, 12A-12C, and 13A-13C.

The user may also apply force to the deployment grip 116, which are one or more raised notches on the surface of the sliding plate 204. Again, the force may be in a direction that is substantially parallel with the back surface 104 of the mobile device 102, and the relative positioning of the sliding plate 204, the pivot plate 202, the parallel tracks 208, and the back plate 206 may be such that the force from a single finger of the user upon the deployment grip 116 of the sliding plate 204 is sufficient to move the stand 100 from the flat position to the deployed position. The bottom edge 108 of the stand 100 may have a lower rim to provide access to the sliding edge 210 or the deployment grip 116 of the sliding plate 204.

The sliding plate 204 is connected to the pivot plate 202 at a moving hinge 212 and connected by a pin 250. The pivot plate 202 is connected to the back plate 206 at a stationary hinge 214. The moving hinge 212 moves relative to the back plate 206 as the sliding plate 204 is moved along the parallel tracks 208, and the stationary hinge 214 remains in a single place relative to the back plate 206 as the sliding plate 204 is moved along the parallel tracks 208. In some embodiments, instead of a hinge, the moving hinge 212 is a flexible material that may easily bend as the sliding plate 204 moves along the parallel tracks 208.

When the stand 100 is in the deployed position, cutouts 218 located on the pivot plate 202 and the sliding plate 204 align to form two vertical channels. A user may locate adjacent fingers in each of the two vertical channels to hold the mobile device in a landscape viewing position, as further shown and described in FIGS. 3A and 3B. In some embodiments, the cutouts 218 are not present, and the pivot plate 202 and the sliding plate 204 are substantially rectangular shaped.

Figure 3A:
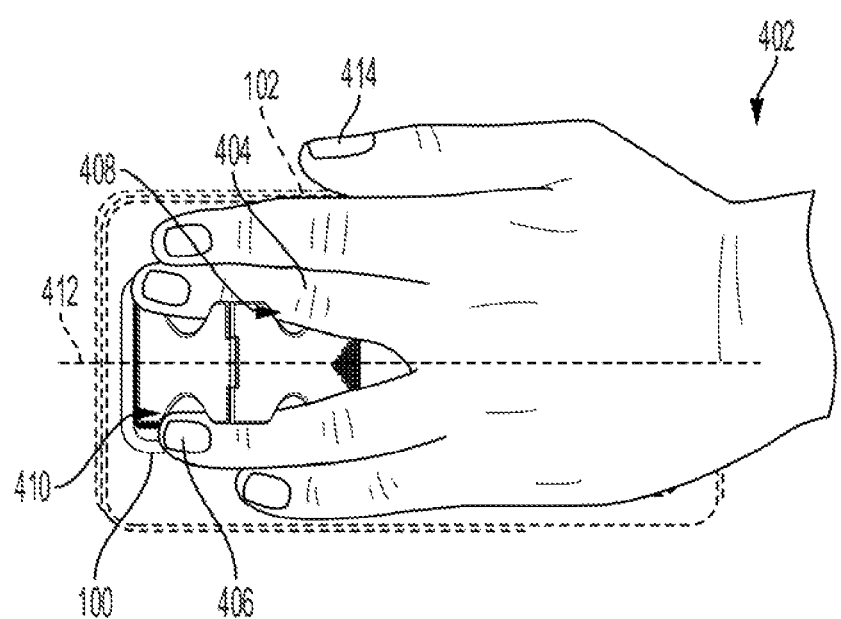
FIGS. 3A-3B illustrate the stand being used by a user to hold the mobile device in a landscape viewing position, according to various embodiments of the invention.
Figure 3B:
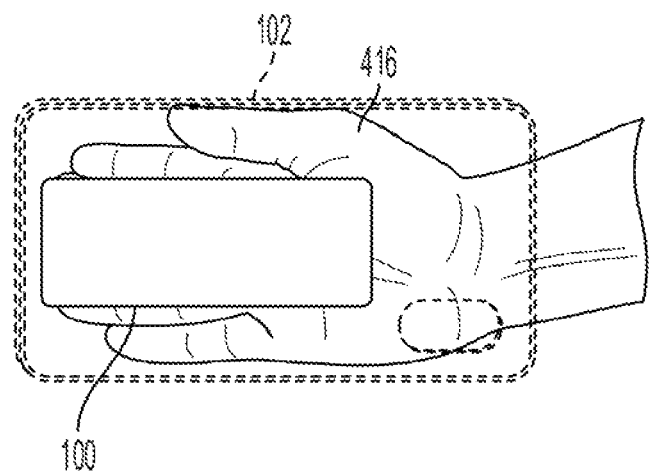

FIGS. 3A and 3B illustrate the stand 100 being used by a user 402 to hold the mobile device 102 in a landscape viewing position. The user 402 is able to place a first finger 404 within a first vertical channel 408 formed by cutouts 218 of the pivot plate 202 and the sliding plate 204 of the stand 100 in the deployed position. The user 402 is also able to place a second finger 406 within a second vertical channel 410 formed by cutouts 218 of the pivot plate 202 and the sliding plate 204 of the stand 100 in the deployed position. The user 402 squeezes the first finger 404 and the second finger 406 toward each other in order to exert pressure on the pivot plate 202 and the sliding plate 204 at the first vertical channel 408 and the second vertical channel 410. The user 402 exerts pressure on the pivot plate 202 and the sliding plate 204 in directions that are perpendicular to the lengthwise axis 412 of the mobile device 102.

The first finger 404 and the second finger 406 may be any non-thumb finger, such as an index finger, a middle finger, a ring finger, or a pinky finger. In some embodiments, the first finger 404 and the second finger 406 are adjacent fingers.

As illustrated in FIG. 3B, by placing the first finger 404 within the first vertical channel 408 and the second finger 406 in the second vertical channel 410 to hold the mobile device 102, a substantial weight of the mobile device 102 may be borne by the first finger 404 and the second finger 406, allowing the thumb 414 to move freely without being responsible for bearing the weight of the mobile device 102. In addition, the mobile device 102 is more securely held by the user 402, resulting in a lower likelihood of dropping and damaging the mobile device 102.

By comparison, when a user conventionally holds a mobile device 102, the user bears the weight of the mobile device 102 at the tips of the user's fingers 404, 406 and the user's thumb 414 or the user's palm 416. By using the thumb 414 or palm 416 to bear the weight of the mobile device 102, the user 402 is limited in thumb dexterity, preventing the user 402 from comfortably reaching all portions of the screen of the mobile device 102. In addition, the mobile device 102 is less securely held by the user 402, resulting in a higher likelihood of dropping and damaging the mobile device 102.

As shown in FIGS. 3A and 3B, the user 402 may use a left hand to hold the mobile device 102 using the stand 100 (as shown in FIG. 3A), or the user 402 may use a right hand to hold the mobile device 102 using the stand 100 (as shown in FIG. 3B). In addition, the user 402 may engage with the stand 100 (using either the left hand or the right hand) from the top of the device, as illustrated in FIGS. 3A and 3B, or from the bottom of the device.

Figure 4A:
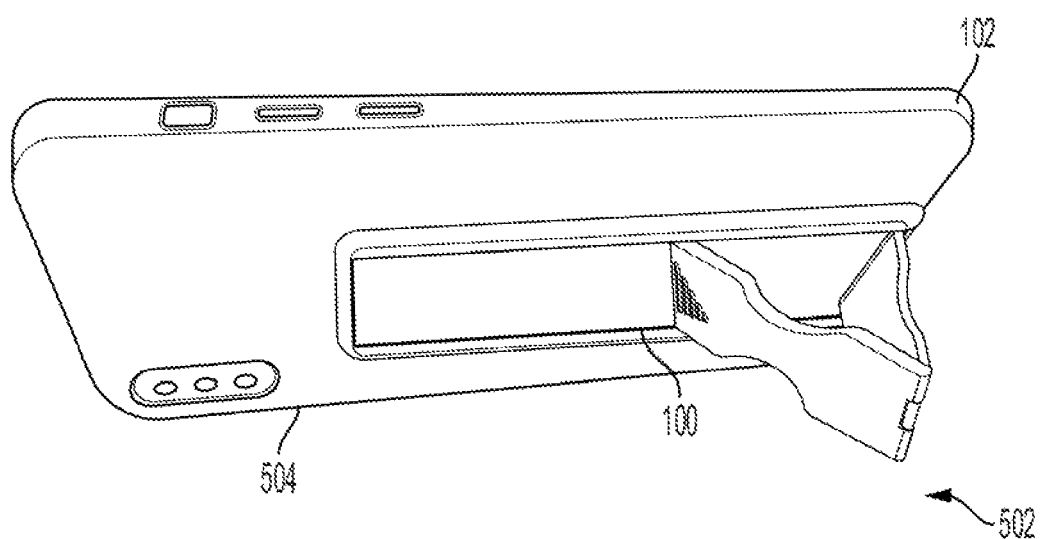
FIG. 4A illustrates the stand being used to prop up the mobile device in a landscape viewing position, according to various embodiments of the invention.

FIG. 4A illustrates the stand 100 being used to prop up the mobile device 102. When the stand 100 is in the deployed position, the stand 100 may prop up the mobile device 102 on a flat surface 502. As shown in FIG. 4A, the mobile device 102 is placed in a landscape orientation, advantageously providing the user with a viewing angle of the screen of the mobile device of between approximately 60 degrees (e.g., between about 50 degrees to about 70 degrees) when the stand 100 is disposed at approximately the widthwise middle of the back surface 104 of the mobile device 102. The viewing angle of the screen of the mobile device may change based on where the stand 100 is located on the back surface 104 of the mobile device 102.

When the stand 100 props up the mobile device 102 on a flat surface 502, the junction of the pivot plate 202 and the sliding plate 204 make contact with the flat surface 502, and a side edge 504 of the mobile device also makes contact with the flat surface 502. The side edge 504 provides a broad and stable contact point. The use of two plates joined at a hinge reduces the likelihood of the stand 100 buckling under the weight of the mobile device 102.

Figure 4B:
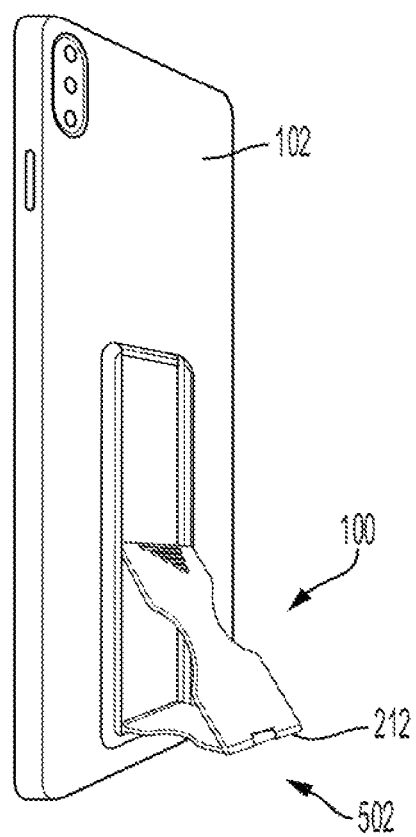
FIG. 4B illustrates the stand being used to prop up the mobile device in a portrait viewing position, according to various embodiments of the invention.

As shown in FIG. 4B, the mobile device 102 and the mobile device stand 100 may be placed in a portrait orientation. In this orientation, the moving hinge 212 and the bottom edge of the mobile device 102 make contact with the flat surface 502 and provide a stable contact point for propping up the mobile device 102.

Figure 5:
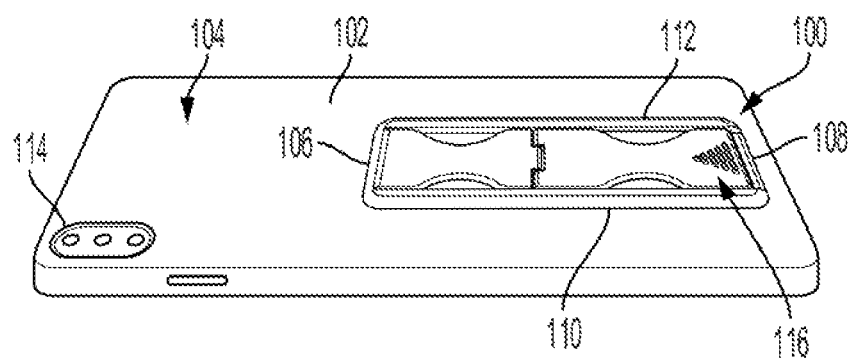
FIG. 5 illustrates a stand attached to a back surface of a mobile device in a second orientation, according to various embodiments of the invention.

FIG. 5 illustrates a stand 100 attached to a back surface 104 of a mobile device 102 in a second orientation. The mobile device 102 may be a smartphone, a tablet, or any portable device with a screen. The stand 100 may be attached directly to the back surface 104 of the mobile device or may be attached to a back surface of a case that is attached to the mobile device 102. Thus, as used herein, "back surface of the mobile device" may refer to the back surface of the mobile device or the back surface of a case attached to the mobile device.

The stand 100 has a top edge 106, a bottom edge 108, a left edge 110, a right edge 112, and a deployment grip 116. While FIG. 5 illustrates the bottom edge 108 of the stand 100 being substantially aligned with the bottom edge of the mobile device 102, the stand 100 may be placed at any location on the back surface 104 of the mobile device 102. In many situations, the user applying the stand 100 to the mobile device 102 may avoid covering features of the mobile device 102, such as a camera 114 or a fingerprint sensor. In some situations, the user may desire to avoid locating the stand 100 at a location along an edge of the mobile device 102, as the user may dock the mobile device 102 or otherwise desire to have clearance along the edge of the mobile device 102. In this way, the user is able to locate the stand 100 at an optimal location for the user based on the user's usage of the mobile device 102 and the features of the mobile device 102.

As shown in FIG. 5, the stand 100 is in a first position, or a flat position. In the flat position, the stand 100 is substantially flat and parallel with the back surface 104 of the mobile device 102.

Figure 6:
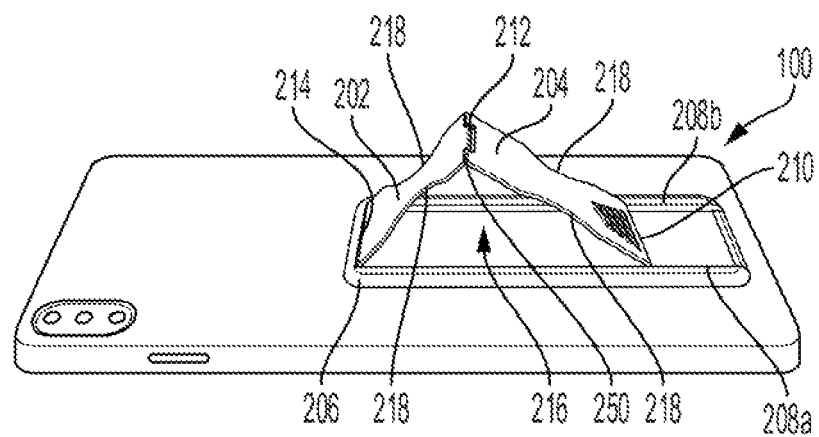
FIG. 6 illustrates the stand in a deployed position in the second orientation, according to various embodiments of the invention.

FIG. 6 illustrates the stand 100 in a second position, or a deployed position. In the deployed position, a pivot plate 202 and a sliding plate 204 form a triangle shape with a back plate 206 of the stand 100. The back plate 206 may form substantially the entire height and width of the stand 100. The back plate 206 may also include parallel tracks 208 (i.e., left track 208A and right track 208B). The sliding plate 204 may slide along the parallel tracks 208 toward the top edge 106 of the stand 100 to move the stand 100 from the flat position shown in FIG. 5 to the deployed position shown in FIG. 6.

The user may apply force to a sliding edge 210 of the sliding plate 204 in a direction toward the top edge 106. The force may be in a direction that is substantially parallel with the back surface 104 of the mobile device 102. The relative positioning of the sliding plate 204, the pivot plate 202, the parallel tracks 208, and the back plate 206 may be such that the force from a single finger of the user upon the sliding edge 210 of the sliding plate 204 is sufficient to move the stand 100 from the flat position to the deployed position. The mechanics of the movement from the flat position to the deployed position are described in more detail in FIGS. 11A-11C, 12A-12C, and 13A-13C.

The user may also apply force to the deployment grip 116, which are one or more raised notches on the surface of the sliding plate 204. Again, the force may be in a direction that is substantially parallel with the back surface 104 of the mobile device 102, and the relative positioning of the sliding plate 204, the pivot plate 202, the parallel tracks 208, and the back plate 206 may be such that the force from a single finger of the user upon the deployment grip 116 of the sliding plate 204 is sufficient to move the stand 100 from the flat position to the deployed position. The bottom edge 108 of the stand 100 may have a lower rim to provide access to the sliding edge 210 or the deployment grip 116 of the sliding plate 204.

The sliding plate 204 is connected to the pivot plate 202 at a moving hinge 212 and connected by a pin 250. The pivot plate 202 is connected to the back plate 206 at a stationary hinge 214. The moving hinge 212 moves relative to the back plate 206 as the sliding plate 204 is moved along the parallel tracks 208, and the stationary hinge 214 remains in a single place relative to the back plate 206 as the sliding plate 204 is moved along the parallel tracks 208. In some embodiments, instead of a hinge, the moving hinge 212 is a flexible material that may easily bend as the sliding plate 204 moves along the parallel tracks 208.

When the stand 100 is in the deployed position, the pivot plate 202, the sliding plate 204, and the back plate 206 define a horizontal channel 216. The horizontal channel 216 is located in a lengthwise middle portion of the mobile device 102. A user may place a finger in the horizontal channel 216 to hold the mobile device in a portrait viewing position, as further shown and described in FIGS. 7A and 7B.

When the stand 100 is in the deployed position, cutouts 218 located on the pivot plate 202 and the sliding plate 204 align to form two vertical channels. A user may locate adjacent fingers in each of the two vertical channels to hold the mobile device in a landscape viewing position, as further shown and described in FIGS. 8A and 8B. In some embodiments, the cutouts 218 are not present, and the pivot plate 202 and the sliding plate 204 are substantially rectangular shaped.

Figure 7A:
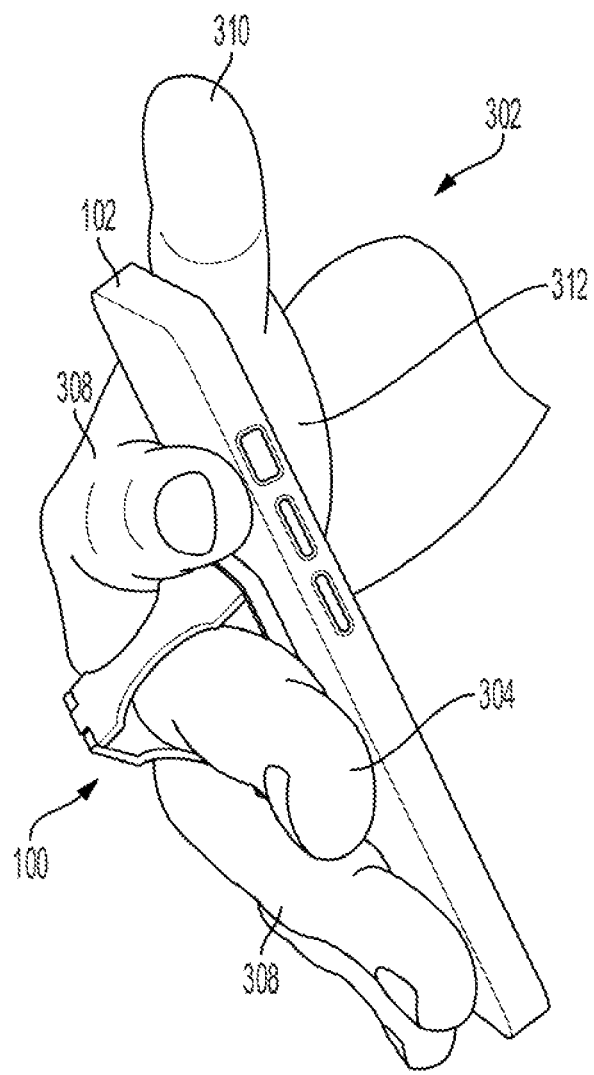
FIGS. 7A-7B illustrate the stand being used by a user to hold the mobile device in a portrait viewing position, according to various embodiments of the invention.
Figure 7B:
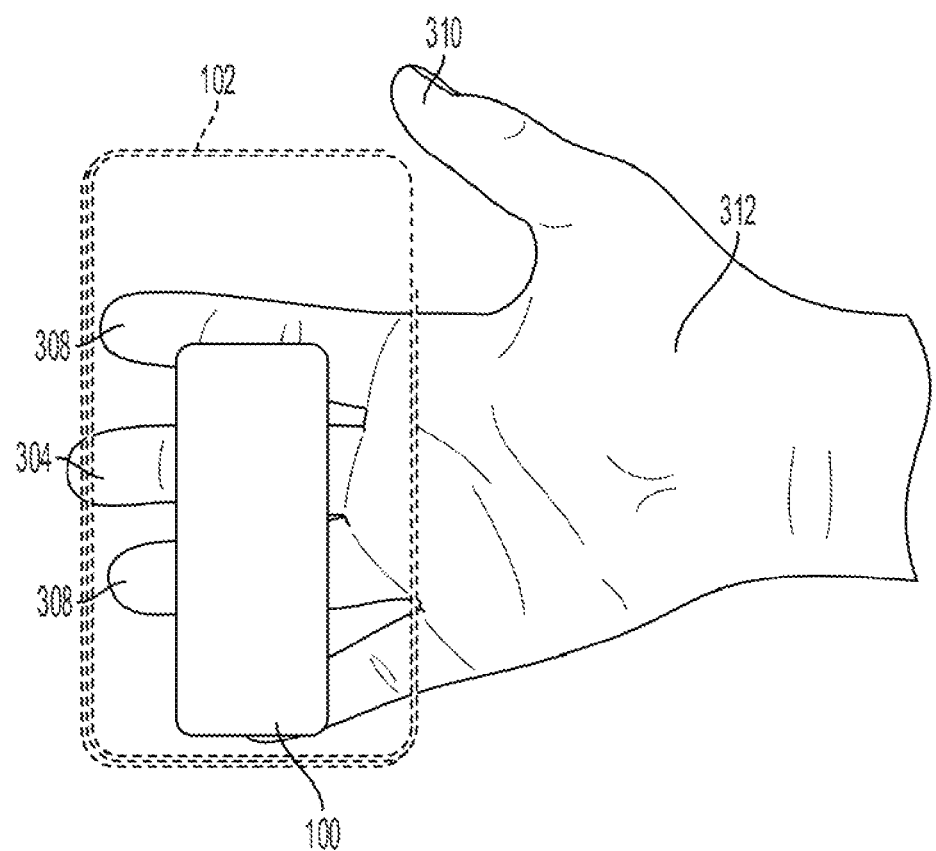

FIGS. 7A and 7B illustrate the stand 100 being used by a user 302 to hold the mobile device 102 in a portrait viewing position. The user 302 is able to place a finger 304 within the horizontal channel 216 of the stand 100 when the stand 100 is in the deployed position. The finger 304 may be any non-thumb finger, such as an index finger, a middle finger, a ring finger, or a pinky finger. By placing the finger 304 within the horizontal channel 216 to hold the mobile device 102, a substantial weight of the mobile device 102 may be borne by the finger 304 and the adjacent fingers 308, allowing the thumb 310 to move freely without being responsible for bearing the weight of the mobile device 102. When the stand 100 is used as shown in FIG. 7A, the user's thumb 310 is better able to reach all portions of the screen of the mobile device 102. In addition, the mobile device 102 is more securely held by the user 302, resulting in a lower likelihood of dropping and damaging the mobile device 102.

By comparison, when a user conventionally holds a mobile device 102, the user bears the weight of the mobile device 102 at the tips of the user's fingers 304, 308 and the user's thumb 310 or the user's palm 312. By using the thumb 310 or palm 312 to bear the weight of the mobile device 102, the user 302 is limited in thumb maneuverability and dexterity, preventing the user 302 from comfortably reaching all portions of the screen of the mobile device 102. In addition, the mobile device 102 is less securely held by the user 302, resulting in a higher likelihood of dropping and damaging the mobile device 102.

FIG. 7B illustrates the ability of the user's thumb 310 to reach all portions of the screen of the mobile device 102. The user's palm 312 is not in contact with the mobile device 102. Accordingly, when the thumb 310 and the palm 312 move to interact with the mobile device 102, the mobile device 102 has a lower likelihood of being dropped and damaged than if the stand 100 was not used.

While FIGS. 7A and 7B illustrate the user 302 using a right hand to hold the mobile device 102 using the stand 100, the stand 100 is also configured to be used by a left hand of the user.

Figure 8A:
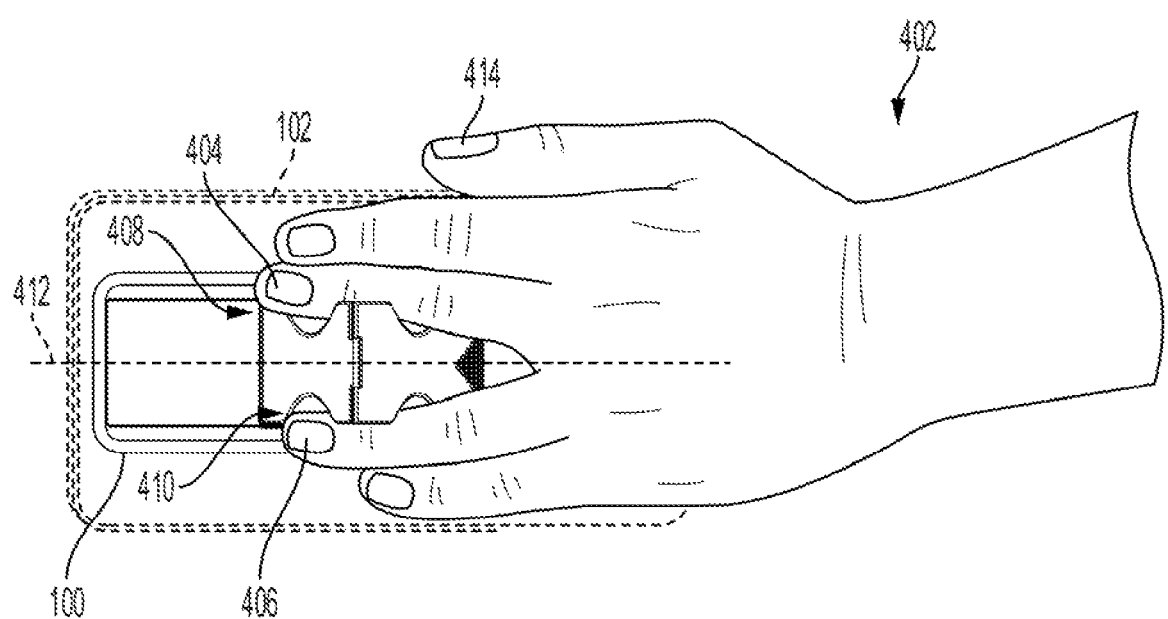
FIGS. 8A-8B illustrate the stand being used by a user to hold the mobile device in a landscape viewing position, according to various embodiments of the invention.
Figure 8B:
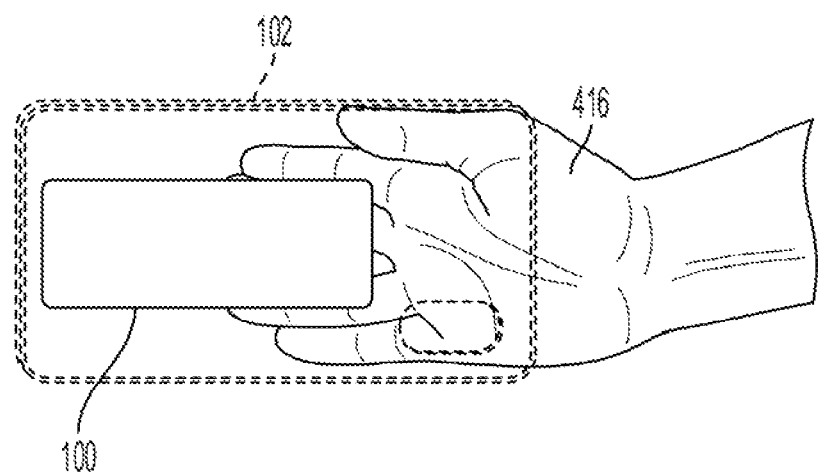

FIGS. 8A and 8B illustrate the stand 100 being used by a user 402 to hold the mobile device 102 in a landscape viewing position. The user 402 is able to place a first finger 404 within a first vertical channel 408 formed by cutouts 218 of the pivot plate 202 and the sliding plate 204 of the stand 100 in the deployed position. The user 402 is also able to place a second finger 406 within a second vertical channel 410 formed by cutouts 218 of the pivot plate 202 and the sliding plate 204 of the stand 100 in the deployed position. The user 402 squeezes the first finger 404 and the second finger 406 toward each other in order to exert pressure on the pivot plate 202 and the sliding plate 204 at the first vertical channel 408 and the second vertical channel 410. The user 402 exerts pressure on the pivot plate 202 and the sliding plate 204 in directions that are perpendicular to the lengthwise axis 412 of the mobile device 102.

The first finger 404 and the second finger 406 may be any non-thumb finger, such as an index finger, a middle finger, a ring finger, or a pinky finger. In some embodiments, the first finger 404 and the second finger 406 are adjacent fingers.

As illustrated in FIG. 8B, by placing the first finger 404 within the first vertical channel 408 and the second finger 406 in the second vertical channel 410 to hold the mobile device 102, a substantial weight of the mobile device 102 may be borne by the first finger 404 and the second finger 406, allowing the thumb 414 to move freely without being responsible for bearing the weight of the mobile device 102. In addition, the mobile device 102 is more securely held by the user 402, resulting in a lower likelihood of dropping and damaging the mobile device 102.

By comparison, when a user conventionally holds a mobile device 102, the user bears the weight of the mobile device 102 at the tips of the user's fingers 404, 406 and the user's thumb 414 or the user's palm 416. By using the thumb 414 or palm 416 to bear the weight of the mobile device 102, the user 402 is limited in thumb dexterity, preventing the user 402 from comfortably reaching all portions of the screen of the mobile device 102. In addition, the mobile device 102 is less securely held by the user 402, resulting in a higher likelihood of dropping and damaging the mobile device 102.

As shown in FIG. 8B the user's palm 416 is not in contact with the mobile device 102. Accordingly, when the thumb 414 and the palm 416 move to interact with the mobile device 102, the mobile device 102 has a lower likelihood of being dropped and damaged than if the stand 100 was not used.

As shown in FIGS. 8A and 8B, the user 402 may use a left hand to hold the mobile device 102 using the stand 100 (as shown in FIG. 8A), or the user 402 may use a right hand to hold the mobile device 102 using the stand 100 (as shown in FIG. 8B). In addition, the user 402 may engage with the stand 100 (using either the left hand or the right hand) from the top of the device, as illustrated in FIGS. 8A and 8B, or from the bottom of the device.

Figure 9:
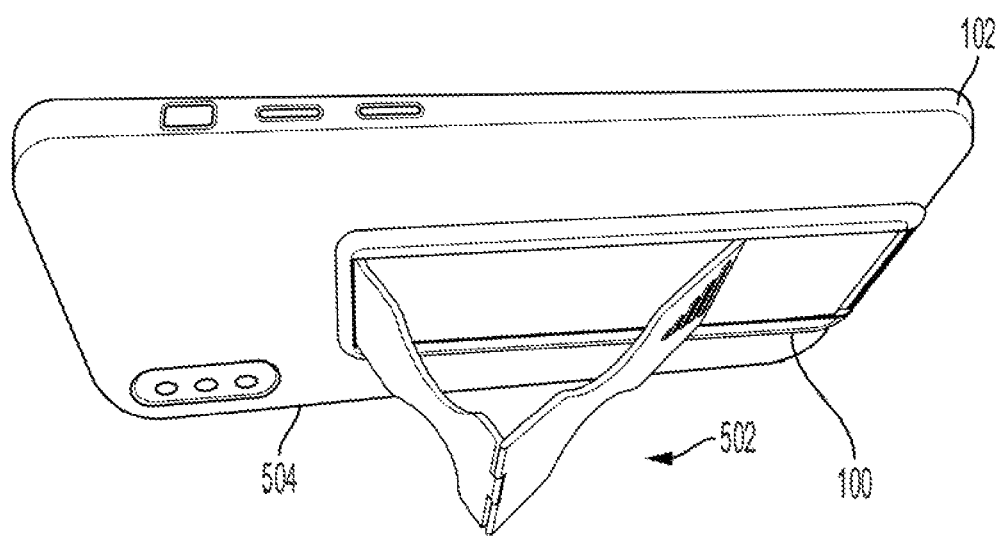
FIG. 9 illustrates the stand being used to prop up the mobile device, according to various embodiments of the invention.

FIG. 9 illustrates the stand 100 being used to prop up the mobile device 102. When the stand 100 is in the deployed position, the stand 100 may prop up the mobile device 102 on a flat surface 502. As shown in FIG. 9, the mobile device 102 is placed in a landscape orientation, advantageously providing the user with a viewing angle of the screen of the mobile device of between approximately 60 degrees (e.g., between about 50 degrees to about 70 degrees) when the stand 100 is disposed at approximately the widthwise middle of the back surface 104 of the mobile device 102. The viewing angle of the screen of the mobile device may change based on where the stand 100 is located on the back surface 104 of the mobile device 102.

When the stand 100 props up the mobile device 102 on a flat surface 502, the junction of the pivot plate 202 and the sliding plate 204 make contact with the flat surface 502, and a side edge 504 of the mobile device also makes contact with the flat surface 502. The side edge 504 provides a broad and stable contact point. The use of two plates joined at a hinge reduces the likelihood of the stand 100 buckling under the weight of the mobile device 102.

The mobile device 102 and the mobile device stand 100 may be placed in a portrait orientation by rotating the stand 100 and the mobile device 102 clockwise or counterclockwise by 90 degrees. In this orientation, the moving hinge 212 and the bottom edge of the mobile device 102 make contact with the flat surface 502 and provide a stable contact point for propping up the mobile device 102 at an angle.

Figure 10A:
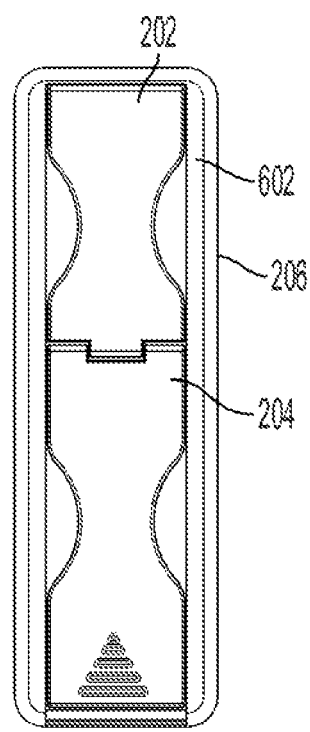
FIG. 10A illustrates a front view of the stand in the flat position, according to various embodiments of the invention.

FIG. 10A illustrates a front view of the stand 100 in the flat position. The stand 100 includes a back plate 206, a pivot plate 202, and a sliding plate 204. The back plate 206 may include a lip 602 that spans a circumference of the stand 100. The lip 602 may define a cavity that receives the pivot plate 202 and the sliding plate 204 when the stand 100 is in the flat position. While the sliding plate 204 is shown as being longer in length than the pivot plate 202, in other embodiments, the sliding plate 204 may be shorter in length than the pivot plate 202 or the sliding plate 204 and the pivot plate 202 may have the same length.

Figure 10B:
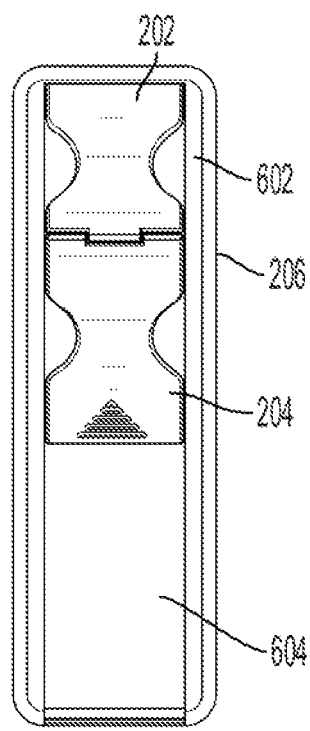
FIG. 10B illustrates a front view of the stand in the deployed position, according to various embodiments of the invention.

FIG. 10B illustrates a front view of the stand 100 in the deployed position. In the deployed position, a top surface 604 of the back plate 206 is exposed, as the sliding plate 204 is moved toward the top edge 106 of the stand 100.

Figure 10C:
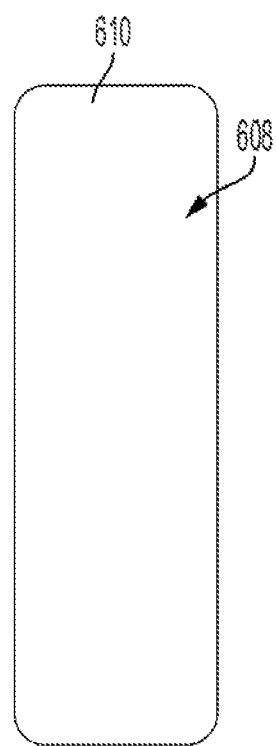
FIG. 10C illustrates a back view of the stand showing the back side of the stand, according to various embodiments of the invention.

FIG. 10C illustrates a back view of the stand 100 showing the back side of the stand 100. The back side has a back surface 608 that is covered by an adhesive 610. The adhesive 610 may completely cover the back surface 608 of the stand 100 or may cover portions of the back surface 608 of the stand 100. The adhesive 610 may be an adhesive that provides a bond with the back surface 104 of the mobile device 102. When the stand 100 is attached to the mobile device 102, the back surface 608 of the stand 100 and the back surface 104 of the mobile device 102 sandwich the adhesive 610. The adhesive 610 prevents movement of the stand 100 relative to the mobile device 102. The adhesive 610 may be an adhesive sheet, such as a tape, or may be an adhesive material applied to the back surface 608, such as glue.

In some embodiments, the adhesive 610 is a temporary adhesive configured to allow release of the stand 100 from the mobile device 102 when the stand 100 is pulled apart from the mobile device 102. In these embodiments, the adhesive 610 may be cleaned or otherwise treated to allow the stand 100 to be re-applied to the back surface 104 of the mobile device 102. In this way, the location of the stand 100 on the back surface 104 of the mobile device 102 may be adjusted and calibrated. In some embodiments, the adhesive 610 may be replaced by another adhesive sheet or material. Again, as used herein, "back surface of the mobile device" may refer to the direct back surface of the mobile device or the back surface of a case that covers the mobile device.

Figure 10D:
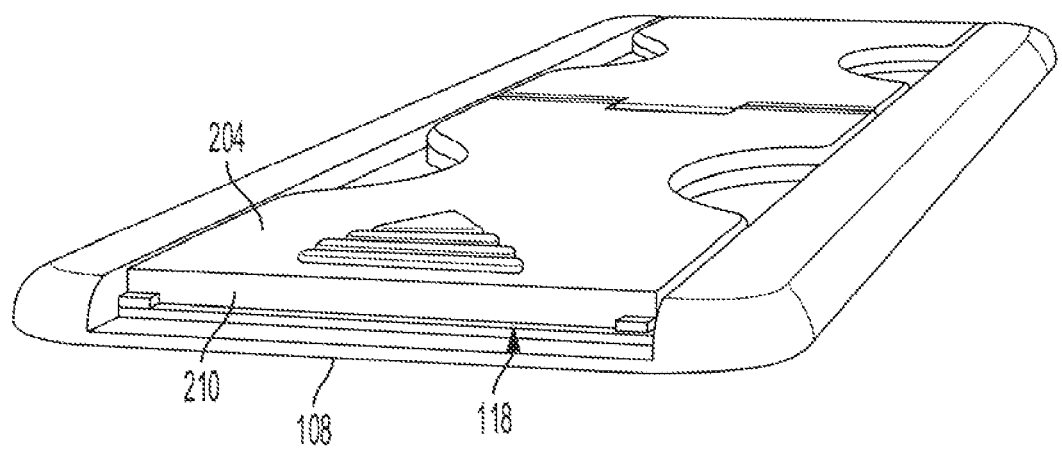
FIG. 10D illustrates a perspective view of the stand showing an end of the stand, according to various embodiments of the invention.

FIG. 10D illustrates the bottom edge 108 of the stand 100. The bottom edge 108 of the stand 100 has a lowered wall 118 that allows for access to the sliding edge 210 of the sliding plate 204.

Figure 11A:
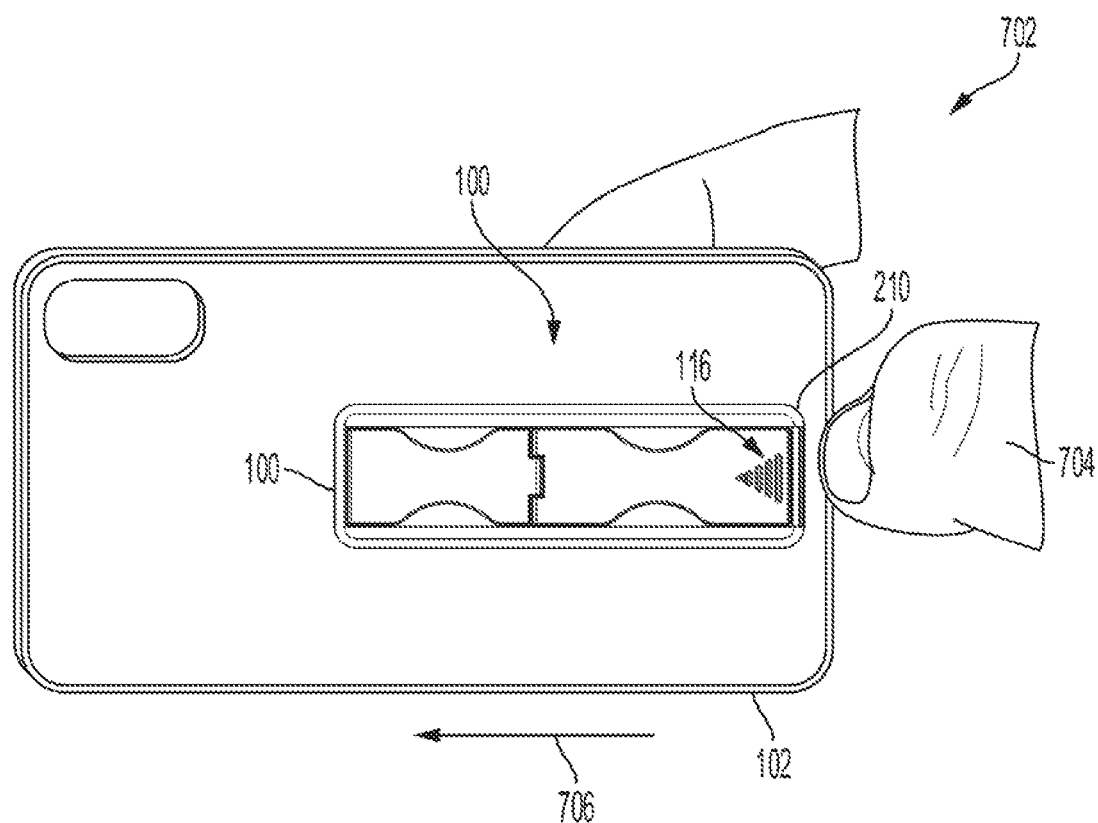
FIGS. 11A-11C illustrate a user moving the stand from the flat position to the deployed position, according to various embodiments of the invention.
Figure 11B:
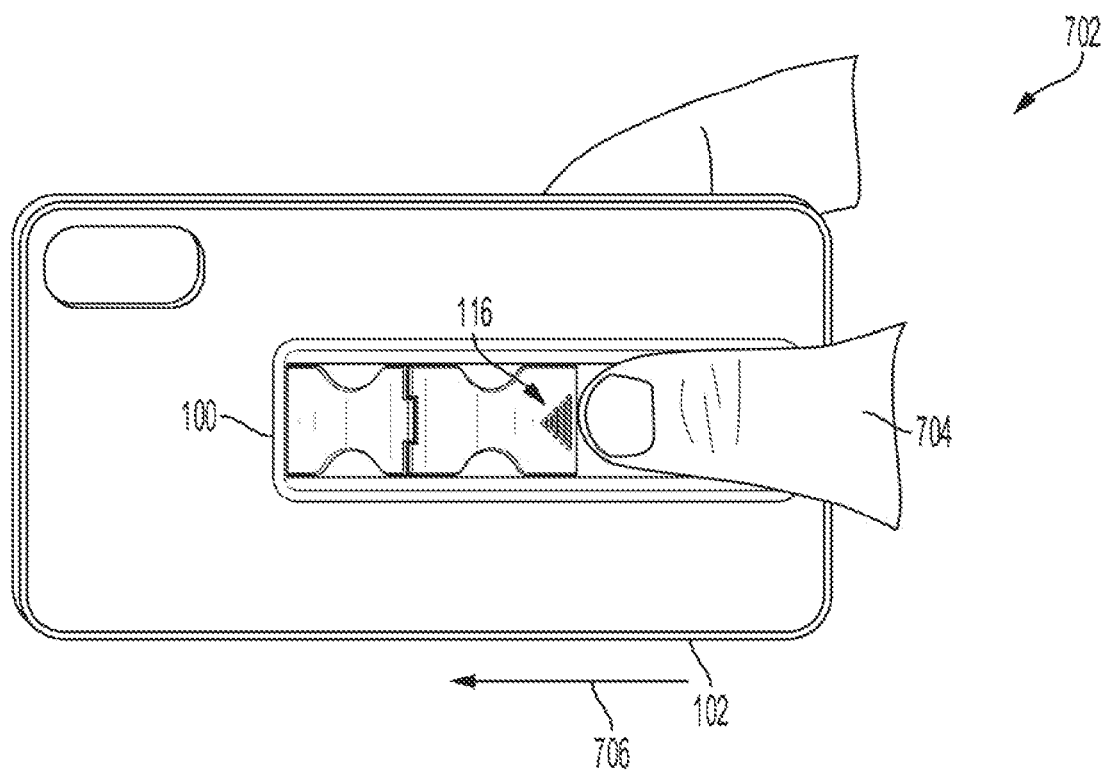
Figure 11C:
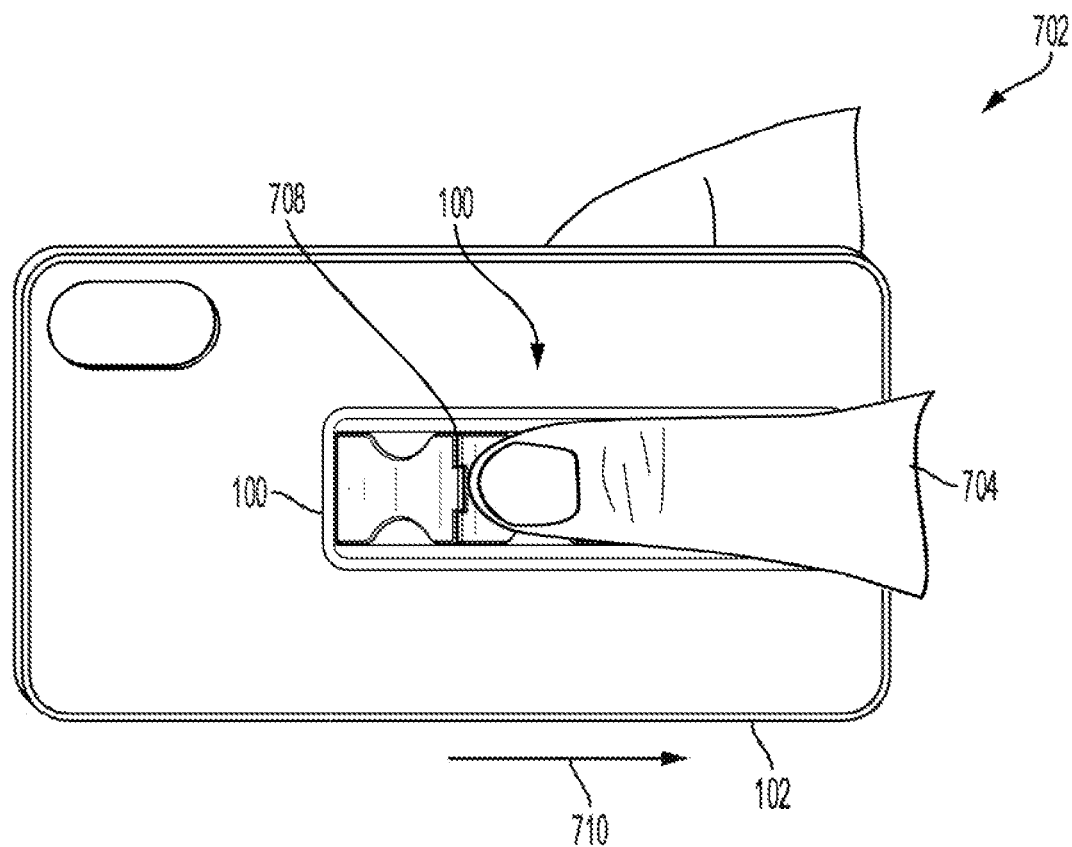

FIGS. 11A-11C illustrate a user moving the stand 100 from the flat position to the deployed position. FIG. 11A illustrates the user 702 using a thumb 704 to engage a sliding edge 210 of the sliding plate 204 of the stand 100 or to engage the deployment grip 116 of the sliding plate 204. The user 702 may use the thumb 704 or any other finger to push the sliding plate 204 in a first direction 706 toward the pivot plate 202. That is, the thumb 704 exerts force onto the sliding plate 204 in the first direction 706.

FIG. 11B illustrates the sliding plate 204 moving toward the pivot plate 202 in the first direction 706. As the sliding plate 204 is pushed by the thumb 704, the sliding plate 204 is angled away from the mobile device 102. The pivot plate 202 also angles away from the mobile device 102 as a result of the pivot plate 202 and the sliding plate 204 being connected at a hinge (i.e., moving hinge 212). The moving hinge 212 moves in location away from the mobile device 102 as the stand 100 is being changed from the flat position to the deployed position. The pivot plate 202 rotates about an axis formed by the stationary hinge 214. The sliding plate 204 is moved until the stand 100 is in the deployed position. When in the deployed position, the sliding edge 210 may be engaged by detents (shown in FIG. 16). The detents may engage the sliding edge 210 to prevent the sliding edge 210 from moving back toward the bottom edge of the stand 100.

FIG. 11C illustrates the user 702 moving the stand 100 from the deployed position to the flat position. The thumb 704 of the user 702 engages a pivot edge 708 of the sliding plate 204. The pivot edge 708 is located on an opposite edge of the sliding plate 204 as the sliding edge 210 of the sliding plate 204. The pivot edge 708 is also a part of the moving hinge 212, where the sliding plate 204 and the pivot plate 202 join.

As the thumb engages the pivot edge 708, a force is exerted onto the sliding plate 204 in the second direction 710. The second direction 710 is opposite the first direction 706. The sliding plate 204 moves away from the pivot plate 202. The sliding plate 204 also angles back toward the mobile device 102 as the sliding plate 204 moves in the second direction 710. The pivot plate 202 also angles toward the mobile device 102 as a result of the pivot plate 202 and the sliding plate 204 being connected at the moving hinge 212. The moving hinge 212 moves in a direction toward the mobile device 102 as the stand 100 is being changed from the deployed position to the flat position. The pivot plate 202 rotates about the axis formed by the stationary hinge 214. The sliding plate 204 is moved until the stand 100 is in the flat position.

As can be seen from FIGS. 11A-11C, the stand 100 can be moved between the flat position and the deployed position using only a single finger (e.g., the thumb 704). In many situations, the user 702 is able to move the stand 100 between the flat position and the deployed position using only one hand. That is, the user 702 is able to move the stand 100 between the flat position and the deployed position by holding the mobile device 102 with the user's fingers and/or palm, and move stand 100 between the flat position and the deployed position using the user's thumb, as shown in FIGS. 11A-11C. Conventional stands or holders require the use of two hands to move the conventional stands and holders between positions.

While FIGS. 11A-11C illustrate the stand 100 in the second orientation of FIGS. 5 and 6, the stand 100 may be in the first orientation of FIGS. 1 and 2, and the foregoing description in FIGS. 11A-11C may be applied.

Figure 12A:
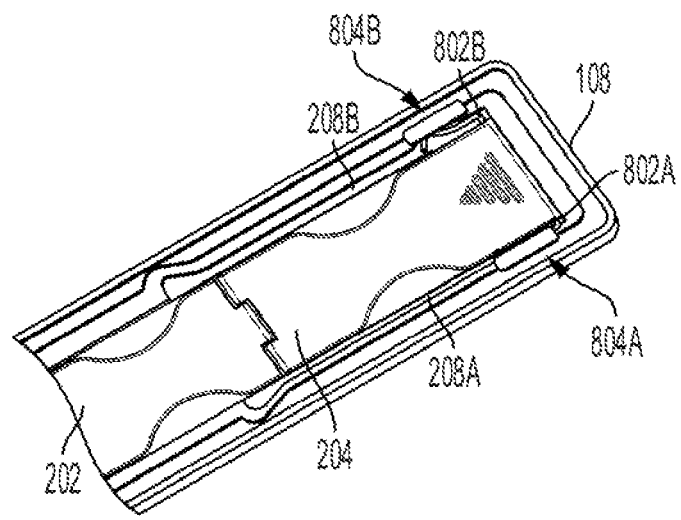
FIGS. 12A-12C illustrate the mechanical structures that enable the one-handed moving of the stand between the flat position and the deployed position, according to various embodiments of the invention.
Figure 12B:
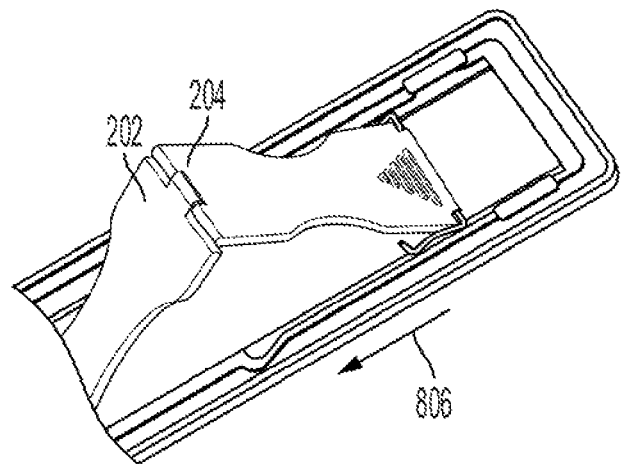
Figure 12C:
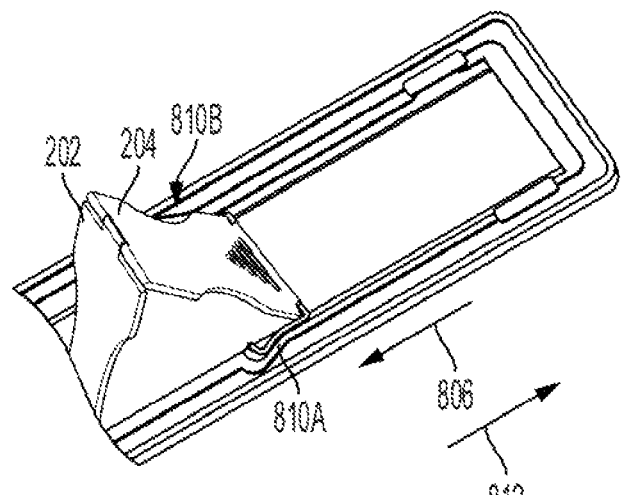

FIGS. 12A-12C and 13A-13C illustrate the mechanical structures that enable the one-handed moving of the stand 100 between the flat position and the deployed position. FIGS. 12A-12C illustrate the stand 100 with a top cover covering the perimeter structure of the stand 100 removed. In some embodiments, the top cover includes the lip 602 of FIG. 10A.

FIG. 12A illustrates the stand 100 in the flat position, similar to FIG. 11A. The sliding plate 204 is connected to two springs 802 (i.e., left spring 802A and right spring 802B). The springs 802 may be two individual springs connected to the sliding plate 204 adjacent to the sliding edge 210 or a single spring that travels through the sliding plate 204 along the sliding edge 210 and protrudes out of both sides of the sliding plate 204.

The back plate 206 includes two tracks 208, and the springs 802 slide along the tracks 208 as the stand 100 moves between the flat position and the deployed position. The tracks 208 each include two pairs of notches. The first pair of notches 804 (i.e., first left notch 804A and first right notch 804B) are located proximal to the bottom edge 108 of the stand 100. The first pair of notches 804 have a shape corresponding to the shape of the springs 802. The springs 802 are naturally urged outward, away from the sliding plate 204. Therefore, when the springs 802 are located within the first pair of notches 804, as shown in FIG. 12A, the sliding plate 204 remains in place, and the stand 100 remains in the flat position. The springs 802 may be tuned to have a spring force such that when in the first pair of notches 804, the sliding plate 204 and the pivot plate 202 do not move, even when the stand 100 is upside down with gravitational force urging the moving hinge 212 downward.

Figure 13A:
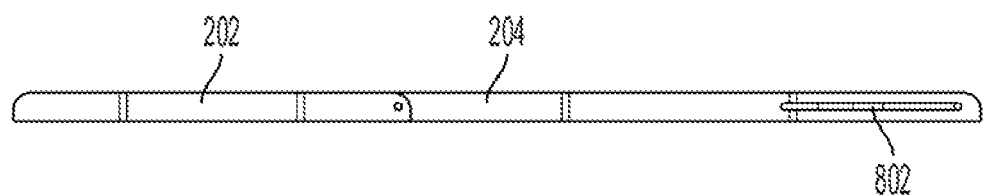
FIGS. 13A-13C illustrate the mechanical structures that enable the one-handed moving of the stand between the flat position and the deployed position, according to various embodiments of the invention.

FIG. 13A corresponds with FIG. 12A and illustrates a side view of the pivot plate 202, the sliding plate 204, and one of the springs 802 when the stand 100 is in the flat position. The spring 802 is pointed in a direction that is parallel with the sliding plate 204 and the back plate 206.

FIG. 12B illustrates the stand 100 transitioning between the flat position and the deployed position, similar to FIG. 11B. The sliding plate 204 and the pivot plate 202 have angled away from the back plate 206 as a force is applied to the sliding plate 204 at the sliding edge 210 in the first direction 806.

The springs 802 have been displaced from the first pair of notches 804, and the springs 802 are located within the track 208. Since the springs 802 are naturally urged outward, when the springs 802 are in the first pair of notches 804 and force is applied to the sliding plate 204 at the sliding edge 210 in the first direction 806, the force must overcome the outward spring force in order to displace the springs 802 from the first pair of notches 804. The springs 802 and the first pair of notches 804 have a corresponding shape that guides the springs 802 out of the first pair of notches 804. In particular, the springs 802 have a curved (or sloped) shape that corresponds to a curved (or sloped) shape of the first pair of notches 804. When the springs 802 are within the track 208 as shown in FIG. 12B, the springs 802 are urged outward, and the springs 802 contact side walls of the track 208. The spring force of the springs 802 is perpendicular to the force applied to the sliding plate 204 at the sliding edge 210 in the first direction 806.

Figure 13B:
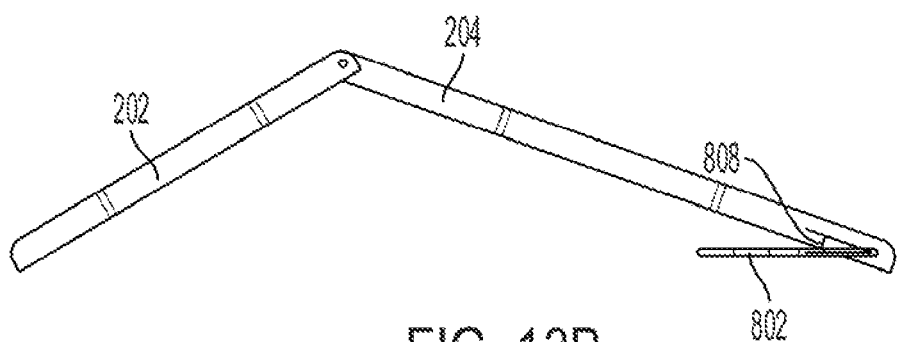

FIG. 13B corresponds with FIG. 12B and illustrates the side view of the pivot plate 202, the sliding plate 204, and one of the springs 802. The spring 802 remains pointed in a direction that is parallel with the back plate 206. The top cover that is not shown in FIGS. 12A-12C ensures the spring 802 is pointed in the direction parallel with the back plate 206, as the top cover and the back plate 206 establish respective top and bottom barriers for the spring 802. The spring 802 and the sliding plate 204 form an angle when the stand 100 is not in the flat position. FIG. 13B illustrates the spring 802 and the sliding plate 204 forming a first angle 808.

FIG. 12C illustrates the stand 100 in the deployed position, similar to FIG. 11C. The springs 802 are now located in the second pair of notches 810. The track 208 ends at the second pair of notches 810, such that the springs 802 may not be advanced farther in the first direction 806 than the second pair of notches 810. In this way, the first pair of notches 804 and the second pair of notches 810 are located at the ends of the track 208 and establish limits of movement of the sliding plate 204 via the springs 802.

The springs 802 and the second pair of notches 810 have a corresponding shape that guides the springs 802 into the second pair of notches 810. In particular, the springs 802 have a curved (or sloped) shape that corresponds to a curved (or sloped) shape of the second pair of notches 810. In some embodiments, the shape of the first pair of notches 804 is similar to the shape of the second pair of notches 810.

When the springs 802 are located in the second pair of notches 810, the shape of the second pair of notches prevents the springs 802 from sliding in the second direction 812 without force being applied to the sliding plate 204 in the second direction 812, as described with respect to FIG. 11C.

When the stand 100 is moved from the deployed position to the flat position, the shape of the second pair of notches 810 guides the springs 802 out of the second pair of notches 810 and into the track 208, and the shape of the first pair of notches 804 guides the springs 802 into the first pair of notches 804 from the track 208. In this way, the movement into and out of the first pair of notches 804 and the second pair of notches 810 is smooth.

The shape of the first pair of notches 804 and the second pair of notches 810 and the springs 802 is such that the springs 802 remain in place within the first pair of notches 804 and the second pair of notches 810 when no force or a small amount of force is applied to the sliding plate 204 in the first direction 806 or the second direction 812, but the springs 802 are not prevented from sliding into and out of the track 208 when a threshold amount of force is applied to the sliding plate 204 in the first direction 806 or the second direction 812.

Figure 13C:
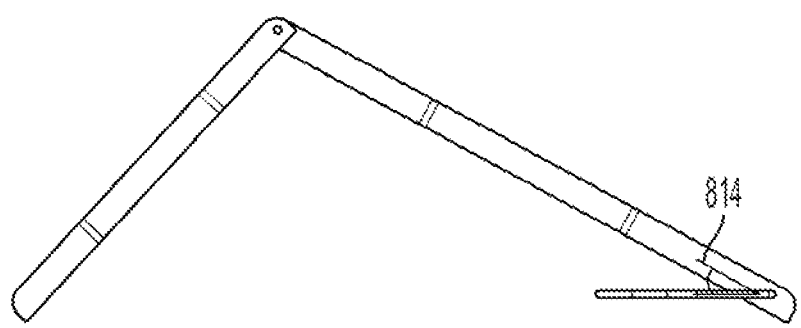

FIG. 13C corresponds with FIG. 12C and illustrates the side view of the pivot plate 202, the sliding plate 204, and one of the springs 802. The spring 802 remains pointed in a direction that is parallel with the back plate 206. The top cover that is not shown in FIGS. 12A-12C ensures the spring 802 is pointed in the direction parallel with the back plate 206, as the top cover and the back plate 206 establish respective top and bottom barriers for the spring 802. The spring 802 and the sliding plate 204 form an angle when the stand 100 is not in the flat position. FIG. 13C illustrates the spring 802 and the sliding plate 204 forming a second angle 814 that is greater than the first angle 808.

FIGS. 14A-14C illustrate a sliding plate 1026, which may be similar to sliding plate 204. FIG. 14A depicts an inner surface of the sliding plate 1026. As shown in FIG. 14A, the sliding plate 1026 is flat, thin and rectangular shaped. The sliding plate 1026 includes a pair of springs 1070 (e.g., springs 802) on a sliding edge 1036 (e.g., sliding edge 210), and a pair of outer hinge portions 1075, which are spaced apart and defining therebetween an inner hinge receiving portion 1039 on a pivot edge 1034 (e.g., pivot edge 708). In some embodiments, the inner surface of the sliding plate 1026 is covered with a padding to provide comfort to a finger of the user when the user holds the stand (e.g., stand 100) as illustrated in FIGS. 7A-7B.

As illustrated in FIGS. 14B and 14C, the outer hinge portions 1075 may appear to protrude in the direction of an inner surface of the sliding plate 1026 and, in one or more embodiments may actually incorporate hooks or hook-like devices. Moreover, in certain embodiments, the outer hinge portions 1075 may have a hole or similar opening for a pin (e.g., pin 250) to extend through the outer hinge portions 1075. Sliding plate 1026 also includes cutouts 1010 similar to cutouts 218, as described herein. Sliding plate 1026 also includes one or more props 1080 (e.g., first prop 1080A and second prop 1080B) that protrude outward from the sliding plate 1026 and are configured to engage with detents 1292 of the back plate 1280 (shown in FIG. 16) to assist transition from the flat position to the deployed position. This process is further illustrated in FIGS. 17A-17D.

FIG. 14B shows an outer surface of the sliding plate 1026.

FIG. 14C shows an edge of the sliding plate 1026. Both side edges of the sliding plate may be rounded or chamfered to provide comfort to the user when the user slides the user's finger to hold the stand as illustrated in FIGS. 7A-7B.

FIGS. 15A-15C illustrate a pivot plate 1127, which may be similar to pivot plate 202. As shown in FIG. 15A, the pivot plate 1127 is flat, thin and rectangular shaped. Moreover, the pivot plate 1127 is shorter than the sliding plate 1026 in order to achieve the desired viewing angle when the stand (e.g., stand 100) is in the open position. The pivot plate 1127 includes cutouts 1110 similar to cutouts 218, as described herein.

The pivot plate 1127 includes a pair of pivot teeth 1128 protruding from the pivot plate 1127 near a pivot edge 1144. The pivot teeth 1128 may, in some embodiments, be inserted into pivot grooves (e.g., pivot grooves 1255 of FIG. 16) of a back plate (e.g., back plate 206) to allow the pivot plate 1127 to pivot between the closed position (where the pivot plate 1127 is substantially parallel and flat against the top surface of the back plate) and the open position (where the pivot plate 1127 is nearly perpendicular to the top surface of the back plate).

A hinge edge 1146 is opposite the pivot edge 1144. In some embodiments, the pivot plate 1127 includes a pair of locking teeth near the hinge edge 1146. The locking teeth are configured to be received by locking grooves of the back plate such that the pivot plate 1127 is locked into the closed position when the locking teeth are engaged by the locking grooves.

Also proximal to the hinge edge, the pivot plate 1127 includes an inner hinge portion 1176. In some embodiments, the inner hinge portion 1176 may be longer than the inner hinge receiving portion 1039 of FIGS. 14A-14B and may further include hooks (not shown). In this manner, the inner hinge portion 1176 substantially fills the inner hinge receiving portion 1039 of FIGS. 14A-14B and is enabled to engage and mate with the outer hinge portion 1075 of FIGS. 14A-14B to substantially form a hinge, such as the moving hinge 212. Further, the pin may be configured to extend through the outer hinge portions 1075 and the inner hinge portion 1176 to strengthen the hinge without restricting or limiting its movement. The hinge allows the sliding plate 1026 and the pivot plate 1127 to flatten out to the closed position (such that both the sliding plate 1026 and the pivot plate 1127 are substantially parallel, flat and housed within the back plate) or be brought together such that they form an acute angle (e.g., a 40 degree to 50 degree angle) which enables the mobile device (e.g., mobile device 102) to sit at an approximately a 60 degree angle in the landscape orientation or held by a user. Other mating techniques for forming hinges known in the art may also be substituted and are within the spirit and scope of this disclosure.

FIG. 15B shows an inner surface of the pivot plate 1127. In some embodiments, the inner surface of the pivot plate 1127 is covered with a padding to provide comfort to a finger of the user when the user holds the stand (e.g., stand 100) as illustrated in FIGS. 7A-7B.

FIG. 15C shows an edge of the pivot plate 1127. Both side edges of the pivot plate may be rounded or chamfered to provide comfort to the user when the user slides the user's finger to hold the stand as illustrated in FIGS. 7A-7B.

In some embodiments, the sliding plate (e.g., sliding plate 204, 1026) and the pivot plate (e.g., pivot plate 202, 1127) may be collectively referred to as a panel having a sliding portion and a pivot portion. The panel may flex at a hinge (e.g., moving hinge 212) or at any other junction, such as a bend or crease.

FIG. 16 illustrates a back plate 1280 similar to back plate 206. The back plate 1280 includes a first pair of notches 1282 (e.g., first pair of notches 804), a second pair of notches 1284 (e.g., second pair of notches 810), and a track 1288 (e.g., track 208) located therebetween. The springs 1070 of the sliding plate 1026 may travel between the first pair of notches 1282 and the second pair of notches 1284, as described herein.

The back plate 1280 includes a top cover 1290 that limits the vertical movement of the springs 1070 along the track 1288 and within the first pair of notches 1282 and the second pair of notches 1284 such that the springs 1070 travel along the track 1288 and are not separated from the track 1288.

The back plate 1280 includes one or more detents 1292 (e.g., first detent 1292A and second detent 1292B) that protrude outward from the top surface 1286 and are configured to engage with props 1080 of the sliding plate 1026 (shown in FIG. 14A) to assist transition from the flat position to the deployed position. This process is further illustrated in FIGS. 17A-17D.

The back plate 1280 includes a pair of pivot grooves 1255 for receiving the pivot teeth 1128 of the pivot plate 1127. The back plate 1280 includes a top surface 1286 that comes in contact with the user's finger when the user holds the stand as illustrated in FIGS. 7A-7B. The top surface 1286 may be covered with a padding to provide comfort to a finger of the user when the user holds the stand as illustrated in FIGS. 7A-7B.

Figure 17A:
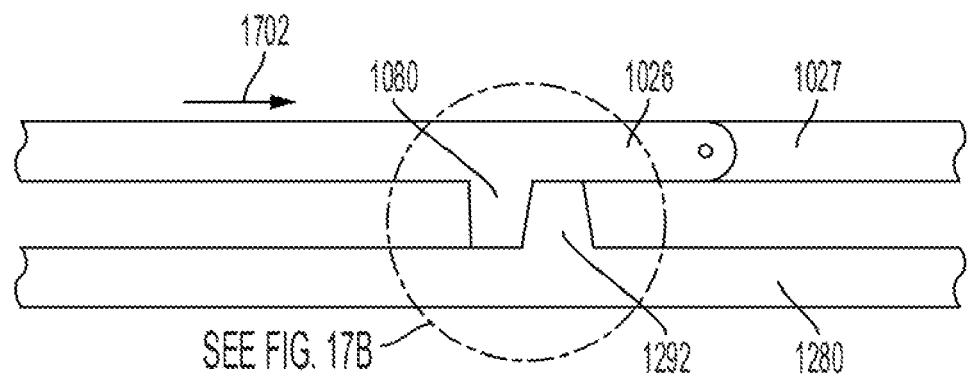
FIGS. 17A-17D illustrate the operation of the detent and the prop, according to various embodiments of the invention.

FIG. 17A-17D illustrates the props 1080 and detents 1292 working together to assist in transition from the flat position to the deployed position. FIG. 17A illustrates the stand in the flat position. The sliding plate 1026 is substantially parallel with the back plate 1280. The props 1080 protruding from the sliding plate 1026 is proximal to the detents 1292 protruding from the back plate 1280, and in some embodiments, the props 1080 and the detents 1292 are in contact with each other.

Figure 17B:
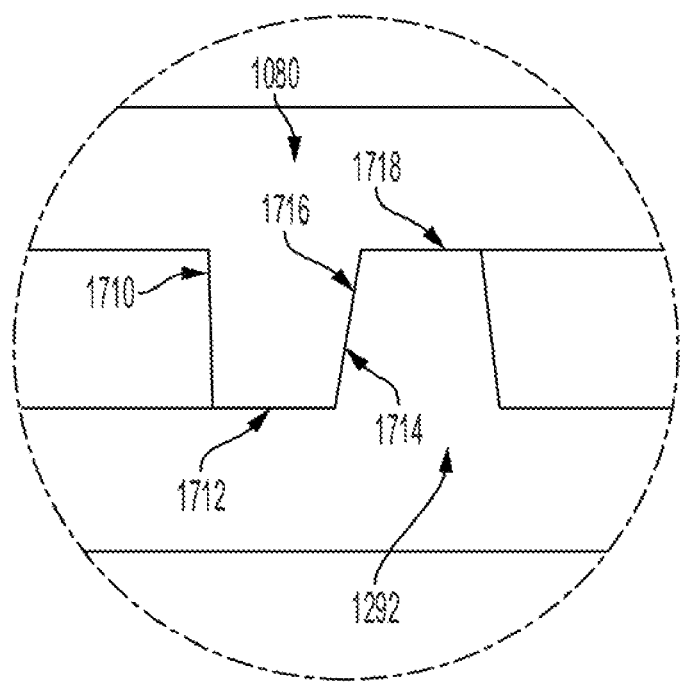

In particular, as shown in FIG. 17B, a sliding edge 1714 of the props 1080 is in contact with a sliding edge 1716 of the detents 1292. The sliding edge 1714 of the props 1080 and the sliding edge 1716 of the detents 1292 are angled toward each other. A top edge 1712 of the props 1080 is substantially flat and makes contact with the back plate 1280. A rear edge 1710 of the props 1080 is shown as being substantially straight, but may be any shape. The top edge 1718 of the detents 1292 is substantially flat and makes contact with the sliding plate 1026.

Figure 17C:
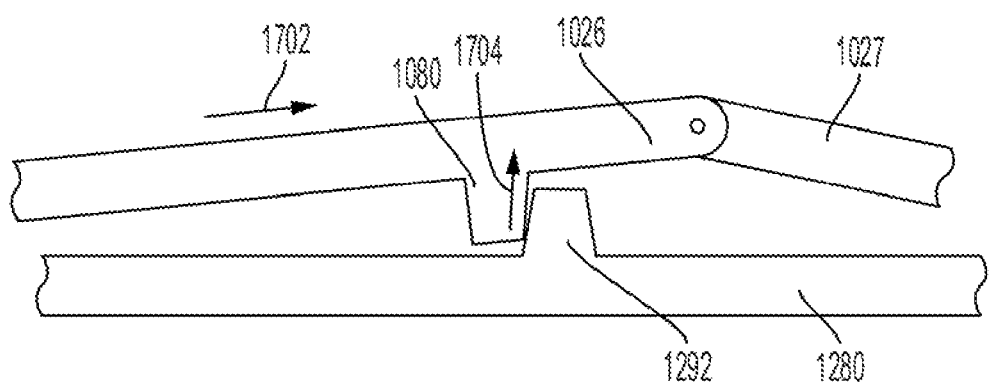

As shown in FIG. 17C, when force is applied in a first direction 1702 to the sliding plate 1026, the sliding edge 1714 of the props 1080 travels up the sliding edge 1716 of the detents 1292 in a sliding direction 1704. The shape of the sliding edge 1714 of the props 1080 and the sliding edge 1716 of the detents 1292 promotes the sliding plate 1026 moving outward, and promotes the pivot plate 1027 and the sliding plate 1026 pivoting at the hinge.

Figure 17D:
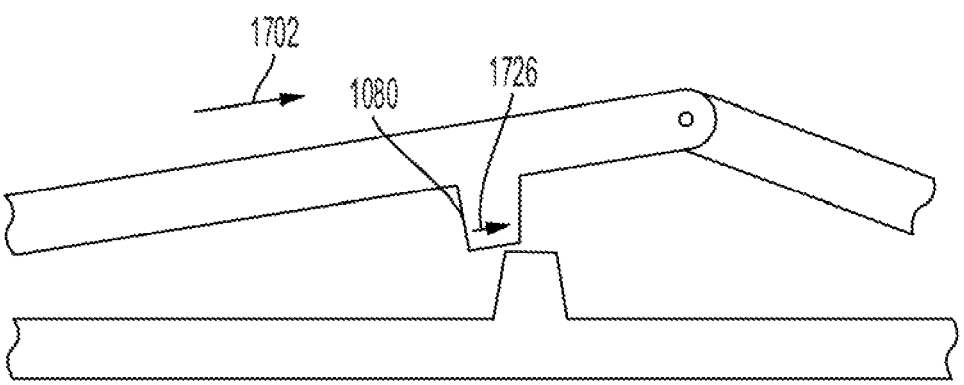

As shown in FIG. 17D, as the props 1080 clear the detents 1292, the pivot plate 1027 and the sliding plate 1026 have pivoted, and the top edge 1712 of the props 1080 slide along the detents 1292 in a sliding direction 1726.

Figure 18:
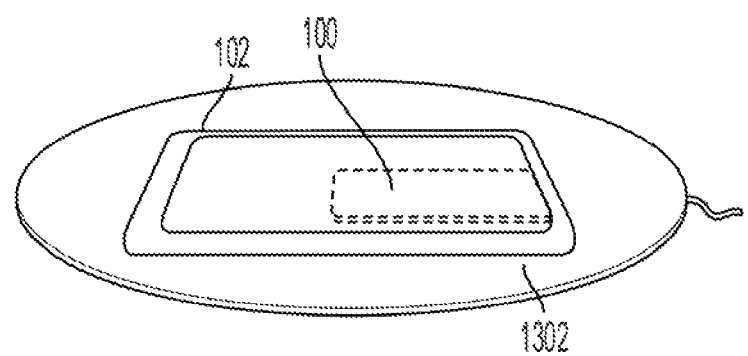
FIG. 18 illustrates the stand attached to a mobile device and used with a wireless charging device, according to various embodiments of the invention.

FIG. 18 illustrates the stand 100 attached to a mobile device 102 and in the flat position. The stand 100 and the mobile device 102 are located on top of a wireless charging mat 1302. Even though the stand 100 lies between the mobile device 102 and the wireless charging mat 1302, the wireless charging mat 1302 is able to inductively charge the mobile device 102 because the materials that the stand 100 are made of (e.g., plastic) do not interfere with the inductive charging process, and the stand 100 is sufficiently thin to not interfere with the inductive charging process. Conventional phone holding rings are made of metal and interfere with wireless charging. In addition, conventional phone holding sockets are not sufficiently thin in thickness to permit wireless charging.

Figure 19A:
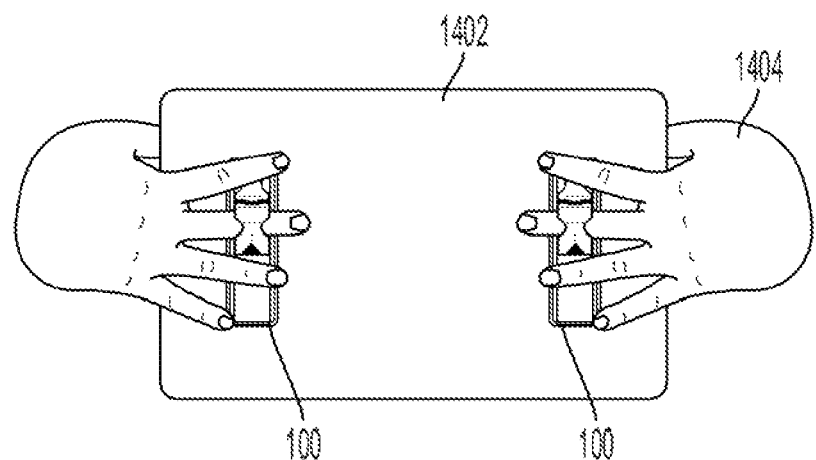
FIGS. 19A-19B illustrate the stand being used with a larger mobile device, such as a tablet, according to various embodiments of the invention.
Figure 19B:
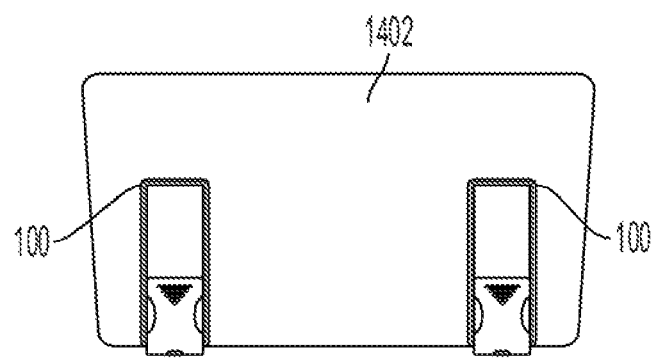

FIG. 19A illustrates the use of two stands 100 on a larger mobile device 1402, such as a tablet. The two stands 100 are able to be placed anywhere on the back surface of the mobile device 1402, and as shown in FIG. 19A, the two stands 100 are used as holders for the user 1404 to securely hold the mobile device 1402 with both hands. The individual stands 100 are strong enough to support the weight of the larger mobile device 1402 when the user 1404 removes one hand and holds the mobile device 1402 using only one stand 100. FIG. 19B illustrates the use of two stands 100 to prop up the larger mobile device 1402. The two stands 100 may evenly distribute the weight of the larger mobile device 1402 to prop it up.

In some embodiments, the sliding plate and the pivot plate are combined into one flexible panel that is flat at rest, but is capable of being bent into the deployed position with force. Instead of the triangular channel illustrated in FIGS. 6 and 7A-7B, the channel is more rounded and may be circular shaped or oval shaped. As the flexible panel is flat at rest, the flexible panel may naturally cause the stand to be urged to the flat position.

Exemplary embodiments of the methods/systems have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. An apparatus for attaching to a mobile device or a case of the mobile device, the apparatus moving between a flat position and a deployed position, the apparatus comprising:
   a back plate having a back surface and configured to be attached to the mobile device or the case of the mobile device;
   a sliding plate coupled to the back plate and having a left cutout on a left side edge of the sliding plate and a right cutout on a right side edge of the sliding plate; and
   a pivot plate connected to the sliding plate at a hinge and coupled to the back plate, the pivot plate having a left cutout on a left side edge of the pivot plate and a right cutout on a right side edge of the pivot plate,
   wherein the left cutout of the sliding plate and the left cutout of the pivot plate align to form a first vertical channel when the apparatus is in the deployed position,
   wherein the right cutout of the sliding plate and the right cutout of the pivot plate align to form a second vertical channel when the apparatus is in the deployed position, and
   wherein the first vertical channel and the second vertical channel are configured to be engaged by a user, allowing the user to hold the mobile device in a landscape orientation when the apparatus is in the deployed position.

2. The apparatus of claim 1, wherein the pivot plate, the sliding plate, and the back plate form a triangular channel when the apparatus is in the deployed position, the channel configured to be engaged by the user, allowing the user to hold the mobile device in a portrait orientation.

3. The apparatus of claim 1, wherein the pivot plate, the sliding plate, and the back plate have a thickness when the apparatus is in the flat position, and wherein the thickness is less than a threshold thickness for allowing wireless charging of the mobile device, and
   wherein the pivot plate, the sliding plate, and the back plate are made of a material that allows for wireless charging of the mobile device.

4. The apparatus of claim 1, wherein the back plate includes a front surface, a top edge, and a bottom edge, the back plate including a pair of parallel tracks located on the front surface of the back plate and extending in a direction from the bottom edge of the back plate toward the top edge of the back plate,
   wherein the sliding plate includes a first end and a second end, the first end of the sliding plate coupled to the back plate and configured to slidably move along the pair of parallel tracks, and the sliding plate configured to pivot relative to the back plate, and
   wherein the pivot plate includes a first end and a second end, the first end of the pivot plate connected to the second end of the sliding plate at a hinge, the second end of the pivot plate connected to the back plate, and the pivot plate configured to pivot relative to the back plate when the first end of the sliding plate slidably moves relative to the pair of parallel tracks.

5. The apparatus of claim 4, further comprising a pair of springs located on side edges of the sliding plate at the first end of the sliding plate, the pair of springs configured to contact the pair of parallel tracks and slide along the pair of parallel tracks.

6. The apparatus of claim 1, further comprising:
one or more sliding-plate protrusions extending outward from an inner surface of the sliding plate; and
one or more back-plate protrusions extending outward from a top surface of the back plate, the one or more sliding-plate protrusions configured to engage with the one or more back-plate protrusions to assist the moving of the apparatus from the flat position to the deployed position.

7. The apparatus of claim 6, wherein the one or more sliding-plate protrusions each include a sliding edge angled relative to the inner surface of the sliding plate,
wherein the one or more back-plate protrusions each include a sliding edge angled relative to the top surface of the back plate, and
wherein the sliding edges of the one or more sliding-plate protrusions contact and slide against the sliding edges of the one or more back-plate protrusions and promote outward movement of the sliding plate and pivoting at the hinge when a force is applied to the sliding plate toward the pivot plate.

8. The apparatus of claim 7, wherein the one or more back-plate protrusions include a retention edge located on an opposite side of the sliding edge, the retention edge configured to engage an edge of the sliding plate to maintain the deployed position.

9. A stand attached to a mobile device or a case of a mobile device, the stand comprising:
a back plate having an adhesive disposed on a back surface of the back plate for attaching to the mobile device or the case of the mobile device;
a sliding plate coupled to the back plate and having a left cutout on a left side edge of the sliding plate and a right cutout on a right side edge of the sliding plate; and
a pivot plate connected to the sliding plate at a hinge and coupled to the back plate, the pivot plate having a left cutout on a left side edge of the pivot plate and a right cutout on a right side edge of the pivot plate,
wherein the left cutout of the sliding plate and the left cutout of the pivot plate align to form a first vertical channel when the stand is in a deployed position, and
wherein the right cutout of the sliding plate and the right cutout of the pivot plate align to form a second vertical channel when the stand is in the deployed position, the first vertical channel configured to receive a first finger of a user and the second vertical channel configured to receive a second finger of the user, allowing the user to hold the mobile device in a landscape orientation when the stand is in the deployed position.

10. The stand of claim 9, wherein the back plate includes a front surface, a top edge, and a bottom edge, the back plate including a pair of parallel tracks located on the front surface of the back plate and extending in a direction from the bottom edge of the back plate toward the top edge of the back plate,
wherein the sliding plate includes a first end and a second end, the first end of the sliding plate coupled to the back plate and is configured to slidably move relative to the pair of parallel tracks, and the sliding plate configured to pivot relative to the back plate, and
wherein the pivot plate includes a first end and a second end, the first end of the pivot plate connected to the second end of the sliding plate at a hinge, the second end of the pivot plate connected to the back plate, and the pivot plate configured to pivot relative to the back plate when the first end of the sliding plate slidably moves relative to the pair of parallel tracks.

11. The stand of claim 10, wherein the pair of parallel tracks have a first end proximal to the bottom edge of the back plate and a second end opposite the first end, the stand being in a flat position when the first end of the sliding plate is located at the first end of the pair of parallel tracks and the stand being in a deployed position when the first end of the sliding plate is located at the second end of the pair of parallel tracks.

12. The stand of claim 9, wherein the pivot plate, the sliding plate, and the back plate are configured to form a triangular channel, the channel configured to receive a finger of the user, allowing the user to hold the mobile device in a portrait orientation.

13. The stand of claim 9, wherein the pivot plate, the sliding plate, and the back plate have a thickness less than a threshold thickness for allowing wireless charging of the mobile device, and
wherein the pivot plate, the sliding plate, and the back plate are made of a material that allows for wireless charging of the mobile device.

14. The stand of claim 9, further comprising:
one or more sliding-plate protrusions extending outward from an inner surface of the sliding plate; and
one or more back-plate protrusions protruding outward from a top surface of the back plate, the one or more sliding-plate protrusions configured to engage with the one or more back-plate protrusions to assist a moving of the stand from a flat position to a deployed position.

15. The stand of claim 14, wherein the one or more sliding-plate protrusions each include a sliding edge angled relative to the inner surface of the sliding plate,
wherein the one or more back-plate protrusions each include a sliding edge angled relative to the top surface of the back plate, and
wherein the sliding edges of the one or more sliding-plate protrusions contact and slide against the sliding edges of the one or more back-plate protrusions and promote outward movement of the sliding plate and pivoting at the hinge when a force is applied to the sliding plate toward the pivot plate.

16. The stand of claim 15, wherein the one or more back-plate protrusions include a retention edge located on an opposite side of the sliding edge, the retention edge configured to engage an edge of the sliding plate to maintain the deployed position.

17. A stand for attaching to a mobile device or a case of the mobile device, the stand moving between a flat position and a deployed position, the stand comprising:
a back plate having a back surface attached to a back surface of the mobile device; and
a panel having:
a first portion coupled to the back plate and having a left cutout on a left side edge and a right cutout on a right side edge, and
a second portion being flexibly connected to the first portion and connected to the back plate, and having a left cutout on a left side edge and a right cutout on a right side edge, the panel and the back plate forming a channel when the stand is in the deployed position, the channel configured to receive a finger of a user, allowing the user to hold the mobile device in a portrait orientation, the left cutout of the first portion and the left cutout of the second portion aligning to form a first vertical channel when the stand is in the deployed position, and the right cutout of the first portion and the right cutout of the second portion aligning to form a second vertical channel when the stand is in the deployed position, the first vertical channel configured to receive a first finger of the user and the second vertical channel configured to receive a second finger of the user, allowing the user to hold the mobile device in a landscape orientation when the stand is in the deployed position.

18. The stand of claim 17, wherein the panel and the back plate have a thickness when the stand is in the flat position, and wherein the thickness is less than a threshold thickness for allowing wireless charging of the mobile device, and
    wherein the panel and the back plate are made of a material that allows for wireless charging of the mobile device.

19. The stand of claim 17, further comprising:
one or more panel protrusions extending outward from an inner surface of the panel; and
one or more back-plate protrusions extending outward from a top surface of the back plate, the one or more panel protrusions configured to engage with the one or more back-plate protrusions to assist a moving of the stand from the flat position to the deployed position.

20. The stand of claim 19, wherein the one or more back-plate protrusions include a retention edge configured to engage an edge of the panel to maintain the deployed position.

* * * * *